(12) United States Patent
Ito

(10) Patent No.: US 6,934,212 B2
(45) Date of Patent: Aug. 23, 2005

(54) SEMICONDUCTOR APPARATUS

(75) Inventor: Yutaka Ito, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/724,684

(22) Filed: Dec. 2, 2003

(65) Prior Publication Data

US 2004/0120201 A1 Jun. 24, 2004

Related U.S. Application Data

(62) Division of application No. 10/077,817, filed on Feb. 20, 2002, now Pat. No. 6,700,826.

(30) Foreign Application Priority Data

Feb. 20, 2001 (JP) ......................................... 2001-043007

(51) Int. Cl.[7] .............................. G11C 7/00; G11C 5/06; G11C 11/24
(52) U.S. Cl. .......................... 365/222; 365/72; 365/149; 365/189.07; 365/189.09; 365/189.11; 365/196
(58) Field of Search ............................ 365/222, 189.11, 365/189.09, 189.07, 196, 149, 72

(56) References Cited

U.S. PATENT DOCUMENTS

| 4,161,791 | A | | 7/1979 | Leach | |
|---|---|---|---|---|---|
| 4,999,811 | A | | 3/1991 | Banerjee | |
| 5,438,539 | A | | 8/1995 | Mori | |
| 5,726,939 | A | * | 3/1998 | Cho et al. ................... | 365/201 |
| 5,798,965 | A | | 8/1998 | Jun | |
| 5,886,920 | A | | 3/1999 | Marshall et al. | |
| 5,949,705 | A | | 9/1999 | Jun et al. | |
| 5,952,692 | A | | 9/1999 | Nakazato et al. | |
| 5,970,007 | A | | 10/1999 | Shiratake | |
| 5,986,946 | A | * | 11/1999 | Shirley ................. | 365/189.11 |
| 6,060,723 | A | | 5/2000 | Nakazato et al. | |
| 6,081,443 | A | | 6/2000 | Morishita et al. | |
| 6,151,244 | A | * | 11/2000 | Fujino et al. ............... | 365/149 |
| 6,169,308 | B1 | | 1/2001 | Sunami et al. | |
| 6,191,441 | B1 | | 2/2001 | Aoki et al. | |
| 6,233,170 | B1 | | 5/2001 | Yamada | |
| 6,314,017 | B1 | | 11/2001 | Emori et al. | |
| 6,317,358 | B1 | | 11/2001 | Keeth | |
| 6,344,992 | B1 | | 2/2002 | Nakamura | |
| 6,452,858 | B1 | | 9/2002 | Hanzawa et al. | |
| 6,473,333 | B1 | | 10/2002 | Tachibana et al. | |

FOREIGN PATENT DOCUMENTS

| EP | 0843360 | 5/1998 |
|---|---|---|
| EP | 0843361 | 5/1998 |
| EP | 0901169 | 3/1999 |
| EP | 0935291 | 8/1999 |
| JP | 63-4671 | 1/1988 |
| JP | 2-54572 | 2/1990 |
| JP | 10-200001 | 7/1998 |
| WO | WO 0021092 | 4/2000 |
| WO | WO 0055906 | 8/2000 |
| WO | WO 0070682 | 11/2000 |

* cited by examiner

Primary Examiner—Hoai Ho
Assistant Examiner—Ly Duy Pham
(74) Attorney, Agent, or Firm—Antonelli, Terry, Stout & Kraus, LLP

(57) ABSTRACT

A simply structured, and highly reliable semiconductor apparatus having a large storage capacity. The apparatus has a plurality of memory cells on one semiconductor substrate, each including a capacitor having first and second electrodes, and a switching device having a control terminal connected to a corresponding word line among a plurality of word lines, and a current channel connected between the first electrode and a corresponding bit line among a plurality of bit lines. When the semiconductor apparatus is in a first mode, an OFF potential of the word lines is set to be a first potential, when the semiconductor apparatus is in a second mode, an OFF potential of the word lines is set to be a second potential, and a current channel of the switching device is set in a direction vertical to the semiconductor substrate.

6 Claims, 18 Drawing Sheets

VBB1 > VBB2

CROSS-SECTION
TAKEN ALONG
WL DIRECTION

CROSS-SECTION
TAKEN ALONG
BL DIRECTION

CROSS-SECTION TAKEN ALONG WL DIRECTION

CROSS-SECTION TAKEN ALONG BL DIRECTION

SEMICONDUCTOR APPARATUS

CROSS-REFERENCE TO RELATED APPLICATIONS

This application is a Divisional of application Ser. No. 10/077,817, filed Feb. 20, 2002 now U.S. Pat. No. 6,700,826, the entire disclosure of which is hereby incorporated by reference.

BACKGROUND OF THE INVENTION

The present invention relates to a semiconductor apparatus, and more particularly, it relates to a technology effectively used for a semiconductor apparatus equipped with a highly reliable semiconductor memory circuit of a large storage capacity.

With regard to a semiconductor memory, there are mainly a random access memory (RAM), and a read only memory (ROM). Among others, a dynamic RAM (DRAM) is most often used as a main memory of a computer. A memory cell for storage includes one capacitor, and a transistor for storing a charge therein, and reading the charge therefrom. This memory is suitable for a large-scale system, because it is realized as a RAM by a minimum number of components. Thus, such memories have been mass-produced at relatively low costs.

In the conventional DRAM, an information charge stored in the capacitor is lost by a pn junction (leakage) current present in the memory cell. Accordingly, before the loss, the memory cell is cyclically refreshed (reproducing and writing operations) to hold stored information. This cycle is called a refreshing period, which is currently around 100 ms. This period must be made longer as a storage capacity is increased more. That is, the leakage current must be suppressed, which has become increasingly difficult with device microfabrication. As a technology for omitting the refreshing operation, the inventors presented a PLED memory in U.S. patent application Ser. No. 09/806,582 filed on Apr. 2, 2001.

SUMMARY OF THE INVENTION

A PLED transistor has a vertical structure, where gate electrodes are disposed in both sides of laminated polysilicon layers, e.g., five layers, via an oxide film, and the gate electrodes made of polysilicon in both sides are integrally formed to have always equal potentials. A transistor substrate (channel) is constructed by setting a polysilicon layer provided between a drain and a source of the transistor as an intrinsic polysilicon (intrinsic Poly Si) layer doped with very low concentration of phosphorus and, between such intrinsic poly Si layers, a tunnel film made of, e.g., a thin silicon nitride film, is formed. The tunnel film serves as a stopper for preventing high-concentration phosphorus of a drain or source region from being dispersed to an inner low-concentration layer during transistor formation. To supply a current between the drain and the source, the tunnel film must be formed in a manner that a thickness of each film thereof is not so large. In a center part, the tunnel film is formed to limit an OFF current of the transistor small. That is, the tunnel film serves as a stopper for preventing a hole or an electron generated by poly Si in the transistor of an OFF state from flowing as a current between the drain and the source, and thus a leakage current can be reduced to zero in theory.

However, with regard to a currently available manufacturing technology, it has been discovered that if the foregoing PLED transistor is formed, intrinsic poly Si between the drain and the source, or a defect generated in the tunnel film, cannot be ignored unlike the case in theory. Therefore, to obtain a memory circuit making good use of a characteristic of the PLED transistor, where a leakage current is reduced to zero as in the foregoing, the manufacturing technology of the PLED transistor remains to be improved much more.

An object of the present invention is to provide a semiconductor apparatus equipped with a simply constituted, highly reliable, and large storage-capacity semiconductor memory circuit. Another object of the present invention is to provide an easily operated semiconductor apparatus while achieving high reliability and a large storage capacity. The above, other objects and features of the present invention will become apparent upon reading of the detailed description of the embodiments and the accompanying drawings.

In accordance with an aspect of the present invention, there is provided a semiconductor apparatus, comprising on one semiconductor substrate: a plurality of memory cells, each including a capacitor having first and second electrodes, and a switching device having a control terminal connected to a corresponding word line among a plurality of word lines, and a current channel connected between the first electrode and a corresponding bit line among a plurality of bit lines. In this case, when the semiconductor apparatus is on a first mode, an OFF potential of the word lines is set to be a first potential, when the semiconductor apparatus is on a second mode, an OFF potential of the word lines is set to be a second potential, and the current channel of the switching device is set in a direction vertical the semiconductor substrate.

In accordance with another aspect of the present invention, there is provided a semiconductor apparatus, comprising on one semiconductor substrate: a plurality of memory cells, each including a MOSFET having an information voltage of a capacitor supplied to a gate, and a writing transistor for supplying the information voltage to the capacitor; a plurality of word lines connected to a second electrode of the capacitor, and a gate of the writing transistor; and a plurality of bit lines disposed in a direction orthogonal to the word lines for receiving a writing voltage and a source output of the MOSFET. In this case, when the semiconductor apparatus is on a first mode, an OFF potential of the word lines is set to be a first potential, when the semiconductor apparatus is on a second mode, an OFF potential of the word lines is set to be a second potential, when the semiconductor apparatus is on the first and second modes, an ON voltage of the word lines is set to be a third voltage for turning OFF the writing transistor when a signal corresponding to the information voltage is read to the bit lines, and turning ON the MOSFET when the information voltage of the capacitor is at a high level, and to be a fourth voltage for turning ON the writing transistor when a writing voltage is supplied from the bit lines to the capacitor, and the writing transistor and the semiconductor substrate are insulated from each other by an insulating material.

Other objects, features and advantages of the invention will become apparent from the following description of the embodiments of the invention taken in conjunction with the accompanying drawings.

DESCRIPTION OF THE EMBODIMENTS

Figure 1:
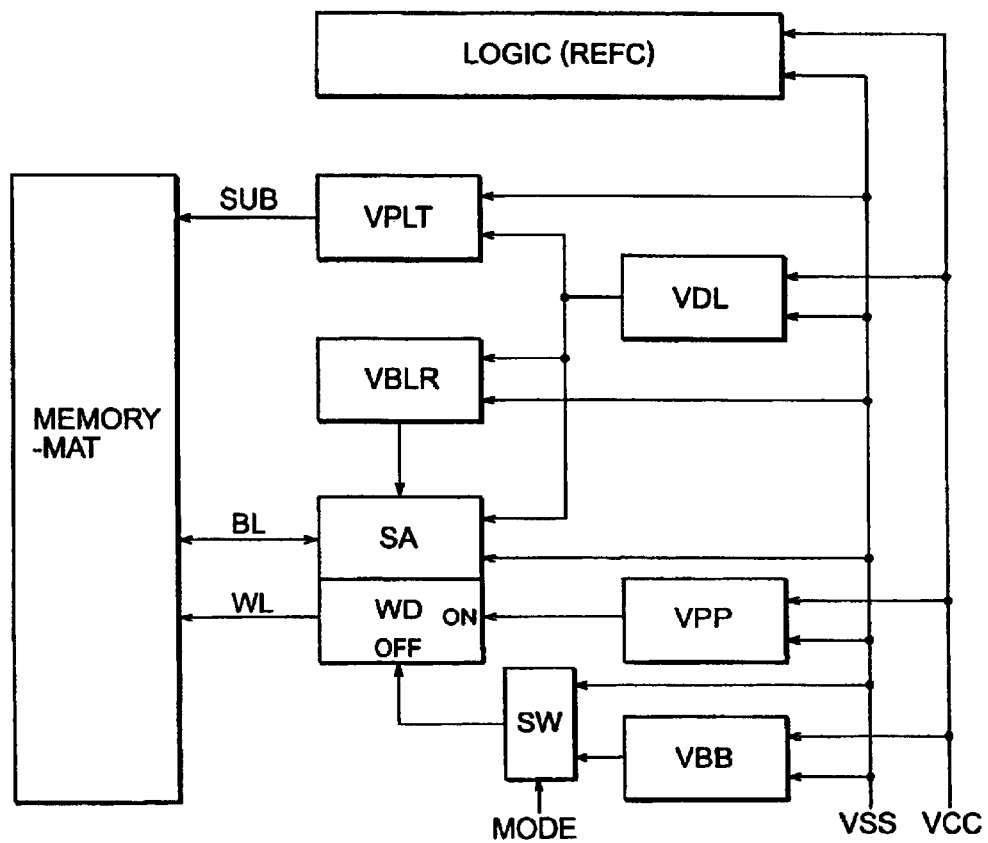
FIG. 1 is a schematic block diagram showing a semiconductor memory according to an embodiment of the present invention.

FIG. 1 is a schematic block diagram showing a semiconductor memory according to an embodiment of the present invention. Circuit blocks in the drawing are all formed on one semiconductor substrate by a well-known manufacturing technology of a semiconductor integrated circuit. Each block of the embodiment is representative one illustrated mainly from a viewpoint of a power supply system for the semiconductor memory. Thus, regarding circuits originally provided for memory operations, a memory mat MEMORY-MAT, a sense amplifier SA, a word driver WD, and a logic circuit LOGIC are illustrate as representatives.

When a semiconductor memory is composed of one semiconductor apparatus as in the case of a general purpose memory or the like, the logic circuit LOGIC includes an I/O interface circuit such as an address buffer, a data buffer, a control buffer or an address decoder, an address selection circuit for selecting a memory cell of the memory map MEMORY-MAP, a control circuit for instructing an operation mode such as writing or reading in the memory cell selected by the address selection circuit, and a refresh control circuit (REFC) for a data holding operation.

The semiconductor apparatus includes a large scale integrated circuit constituting a system LSI or the like. If the semiconductor apparatus is applied to a built-in memory circuit, and access is made to the memory circuit from a logic circuit included in the large scale integrated circuit or an internal circuit such as a CPU or a processor, an I/O interface such as an address buffer can be omitted.

The memory mat MEMORY-MAT takes a storage form for holding an information voltage in a capacitor as described later, and as a switching device for supplying the information voltage to the capacitor, a PLED transistor is used. Though there are no particular limitations, the PLED transistor of the embodiment has its control terminal connected to a word line and, when the word line is set to an ON voltage (selection level), the PLED transistor is turned ON to supply a writing voltage to the capacitor, or read the information voltage held in the capacitor to a bit line. In such a PLED transistor adapted to write/read the information voltage stored in the capacitor, a writing/reading operation is performed based on an operation principle similar to that of a conventional dynamic memory cell using one MOS transistor and one capacitor.

The word driver WD is provided to selectively perform the foregoing writing/reading operation in the memory cell. The word driver WD includes an operation voltage terminal ON for receiving an ON voltage, and an operation voltage terminal OFF for receiving an OFF voltage. A selection level of the word line WL is set as a voltage supplied to the operation voltage terminal ON; and an unselection level of the word line WL as a voltage supplied to the operation voltage terminal OFF.

In the embodiment, for the voltage supplied as the unselection level of the word line WL to operation voltage terminal OFF, either a circuit ground potential VSS or a negative voltage generated by a substrate bias voltage circuit VBB is supplied through a switching circuit SW. The switching circuit SW supplies the circuit ground potential on a normal operation mode, where an operation mode signal MODE is received to permit writing/reading to be performed in the memory cell. The switching circuit SW supplies the negative voltage VBB on a data holding mode, where a selective writing/reading operation in the memory cell is stopped, and only a data holding operation is performed. By supplying such a negative voltage to the control terminal, a leakage current generated on the data holding mode by a defect or the like of the PLED transistor can be greatly reduced, and brought close to a logical value. Accordingly, a refreshing cycle of the memory cell on the data holding mode can be greatly reduced, enabling consumption of current to be reduced on the data holding mode.

Though there are no particular limitations, the operation mode signal MODE is generated by the logic circuit LOGIC. The logic circuit LOGIC supplies the circuit ground potential VSS by the switching circuit SW with the operation mode signal MODE set as one logical level during a normal operation, and the negative voltage VBB by the switching circuit SW with the operation mode signal MODE set as the other logical level corresponding to a data holding mode signal entered through the control buffer. In corresponding relation to such an operation mode, the refresh control circuit REFC included in the logic circuit LOGIC makes a refreshing cycle longer on the data holding mode than that on the normal operation mode corresponding to a data holding characteristic of the memory cell.

When the interface circuit included in the logic circuit LOGIC is compliant with a well-known synchronous DRAM, the data holding mode is formed by a command for instructing a data holding mode. For example, a clock signal CLK, a clock enable signal CKE, a chip selection signal CS, a column address strobe signal CAS, a row address strobe signal RAS, an external control signal such as an enable signal WE, DM, DQS and address signals are used, and an operation mode of the synchronous DRAM operation mode is instructed based on level changes or timings of such signals. A command is provided for instructing a data holding mode by combining the control signals, and the operation mode signal MODE is formed by a command decoder. Each of the above signals contains a so-called bar signal for changing a low level to an active level, but discrimination thereof is omitted.

Among the foregoing signals, the chip selection signal CS instructs a start of a command input cycle by its low level. A high level (chip unselection state) of the chip selection signal CS, and other inputs have no significance. However, a selection state of a memory bank or an internal operation such as a burst operation is not affected by a change to the chip unselection state. The signals RAS, CAS and WE have functions different from those of corresponding signals in the normal DRAM, and become significant when a command cycle is defined. The clock enable signal CKE is a signal indicating validity of a next clock signal. When the signal CKE is at a high level, a rising edge of the next clock signal CLK is validated, and invalidated when it is at a low level.

A boosted voltage generated by a booster circuit VPP is supplied to the operation voltage terminal ON of the word driver WD. Accordingly, an ON voltage of the word line WL is set high similarly to the boosted voltage VPP. A step-down circuit VDL generates a stepped-down voltage obtained by stepping down a power supply voltage VCC supplied from an external unit. For example, when a power supply voltage VCC supplied from an external terminal is about 3.3V, a stepped-down voltage of 2 or 1.8V is generated, and used as an operation voltage for the sense amplifier SA. The sense amplifier SA receives the voltage VDL and the circuit ground potential VSS, and sets an amplifying signal applied to the bit line to a high level similarly to the voltage VDL or a low level similarly to the ground potential VSS.

A voltage generation circuit VBLR receives the stepped-down voltage VDL, and generates a bit line precharging voltage VBLR corresponding to its half (VDL/2). This precharging voltage VBLR is supplied to a later-described precharging circuit (bit line equalizing circuit) included in the sense amplifier SA. The voltage generation circuit VPLT receives the stepped-down voltage VDL, and generates a plate voltage VPLT corresponding to its half (VDL/2). This plate voltage VPLT is supplied to an electrode (plate) common to a plurality of capacitors provided in the memory mat MEMORY-MAT.

A voltage of a high level similar to the voltage VDL may be supplied to one electrode of the capacitor according to information to be stored, or a voltage of a low level similar to the circuit ground potential VSS may be supplied to the electrode. In either case, since the plate voltage VPLT is set to a potential about half of that of the voltage VDL, a voltage applied to a dielectric film constituting the capacitor can be limited to a small value, i.e., about half of the voltage VDL. Thus, since a withstand voltage can be reduced, and a undesired leakage current following a reduction in an applied voltage can also be reduced, the dielectric film can be reduced in thickness to its limit.

Figure 2:
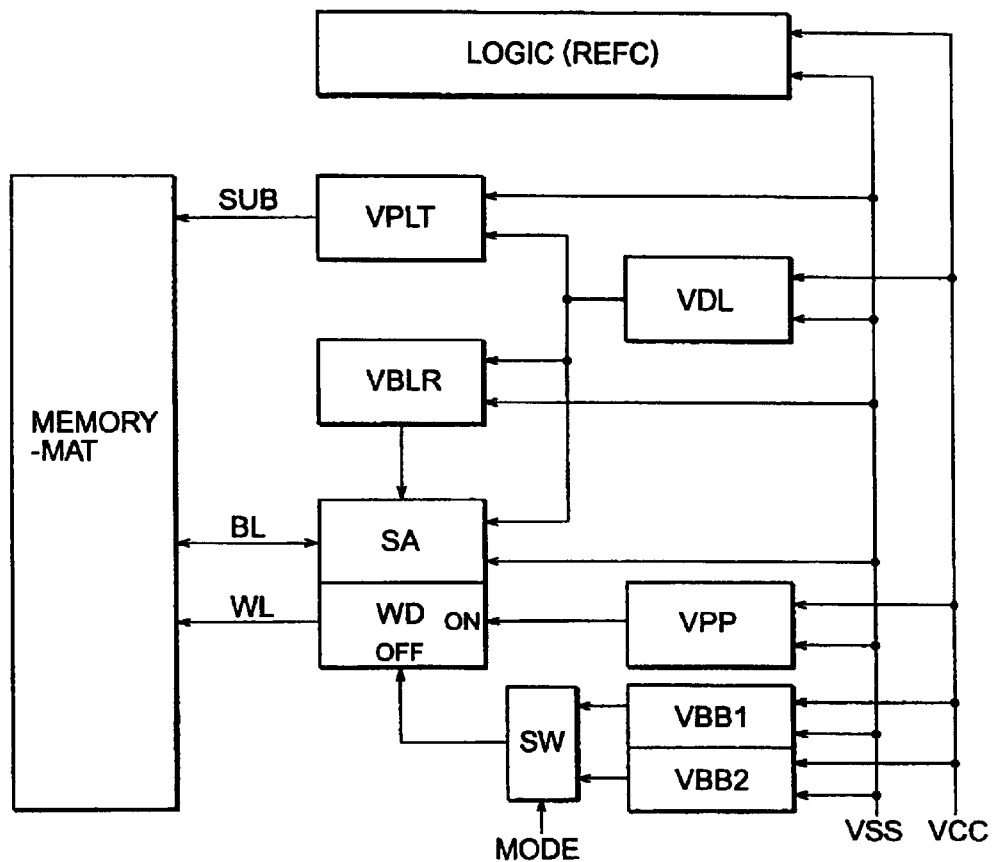
FIG. 2 is a schematic block diagram showing a semiconductor memory according to another embodiment of the present invention.

FIG. 2 is a schematic block diagram showing a semiconductor memory according to another embodiment of the present invention. In the embodiment, two voltages supplied to an operation voltage terminal OFF corresponding to an OFF voltage of a word driver WD are both set as negative voltages VBB1 and VBB2. The voltage VBB1 is set to about $-\frac{1}{5}$V, the voltage VBB2 to −3V, and a relation between the two is set to VBB1>VBB2.

A mode switching circuit SW supplies the negative voltage VBB1 on a normal operation mode, where an operation mode signal is received to permit writing/reading to be performed in a memory cell, and the negative voltage VBB2 on a data holding mode, where a selective writing/reading operation in the memory cell is stopped, and only a data holding operation is performed. By supplying such a negative voltage to a control terminal, it is possible to greatly reduce a leakage current generated on the normal operation mode or the data holding mode by a defect or the like of a PLED transistor. This constitution enables the leakage current on the data holding mode to be brought close to zero as in the case of an ideal characteristic.

Figure 3:
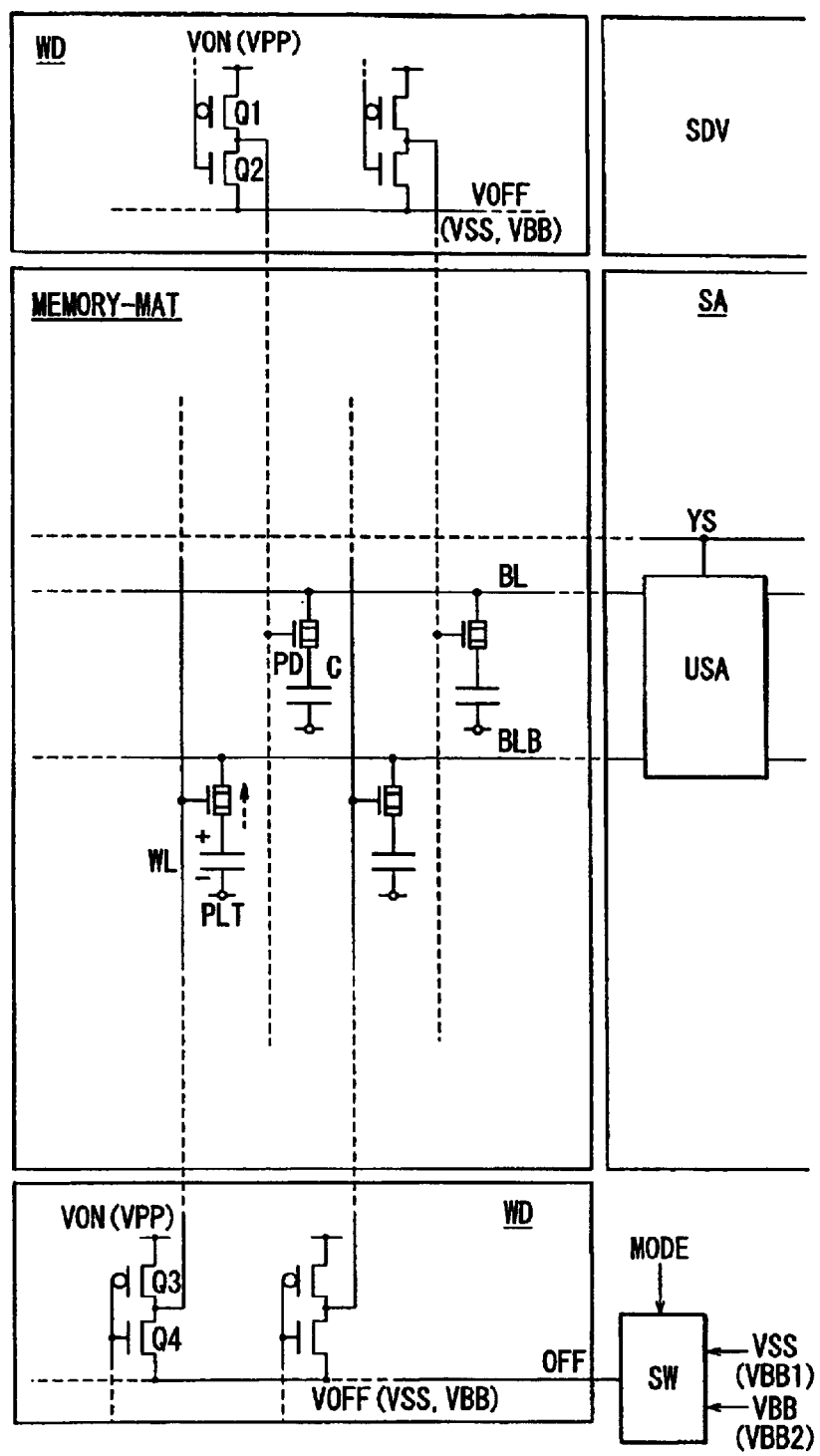
FIG. 3 is a circuit diagram showing an embodiment of a memory mat and its peripheral circuit of FIG. 1 or 2.
Figure 4:
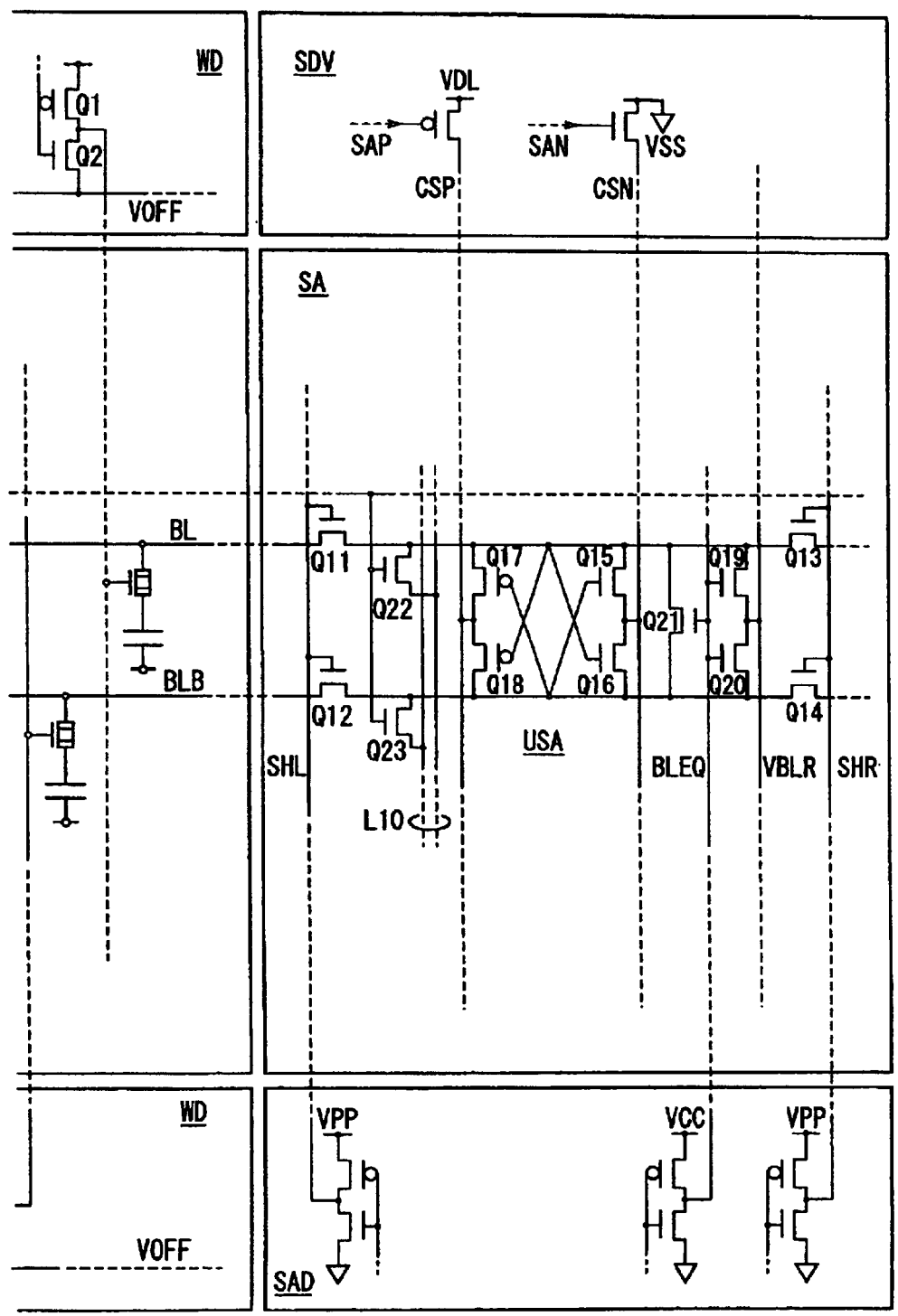
FIG. 4 is a circuit diagram showing an embodiment of the memory mat and its peripheral circuit of FIGS. 1 or 2.

Each of FIGS. 3 and 4 is a circuit diagram showing an embodiment of the memory mat and its peripheral circuit of FIG. 1 or 2. In the semiconductor memory of the embodiment, though not limited to such, a memory array is divided in a plurality in a word-line direction, and similarly in a bit-line direction. A memory mat MEMORY-MAT is provided corresponding to the divided word lines and bit lines, thereby establishing so-called hierarchical word-line and bit-line systems.

The memory mat MEMORY-MAT is sandwiched between sense amplifiers SA and between word drivers WD, and surrounded with the same. In the drawing, only one of the sense amplifiers SA provided for the memory mat MEMORY-MAT is shown. In an intersection between the sense amplifier SA and the word driver WD, for example, a sense amplifier driving circuit SDV or the like is provided. A unit amplifier circuit provided in the sense amplifier SA is constructed based on a shared sense system as shown in FIG. 4. Around the unit amplifier circuit USA of the sense amplifier, complimentary bit lines are provided left and right, and selectively connected to left and right complimentary bit lines BL and BLB of the memory mat MEMORY-MAT.

As shown in FIG. 3, the word line WD generates a selection signal/unselection signal of a word line WL. In the hierarchical word-line system, not shown, to reduce the number of main word lines, in other words, to reduce wiring pitches of main word lines, a plurality of word lines are disposed in a complimentary bit-line direction with respect to one main word line, though not limited to such. The word driver WD has a function of selecting one of the word lines WL, a plurality of which are disposed in the complimentary bit-line direction. Accordingly, the word driver WD selects a word line WL based on the main word line and a word line selection signal for selecting one from the plurality of word selection lines.

As shown in FIG. 3, a memory cell is provided between the word line WL, and the bit line BL of the complimentary bit lines BL and BLB, and composed of a switching device PD including a PLED transistor, and a capacitor C for storage. A control terminal (gate) of the switching device PD is connected to the word line WL; a drain of the switching device to the bit line BL; and one electrode of the capacitor for storage to a source. The other electrode of the capacitor C is made common to receive a plate voltage VPLT.

When the sense amplifier SA is operated by an internal stepped-down voltage VDL, a high level of a voltage amplified by the sense amplifier and applied to the bit line BL (or BLB) is set equal to a level of the internal voltage VDL. Thus, a high voltage VPP corresponding to a selection level of the word line WL is represented by VDL+Vth+α. Here, Vth denotes a threshold voltage of the PLED transistor.

As shown in FIG. 4, a unit circuit of the sense amplifier includes N channel amplifiers MOSFET Q15 and Q16, and P channel amplifiers MOSFET Q17 and Q18, where gates and drains are intersected and connected. Sources of the N channel amplifiers MOSFET Q15 and Q16 are connected to a common source line NCS. Sources of the P channel amplifiers MOSFET Q17 and Q18 are connected to a common source line PCS. Power switches MOSFET provided in the intersection areas are connected to the common source lines NCS and PCS.

Though not particularly limited, the common source line NCS, to which the sources of the N channel amplifiers MOSFET Q15 and Q16 are connected, is driven by the sense amplifier driving circuit SDV provided in the intersection area. That is, by the N channel power switch MOSFET receiving a sense amplifier activation signal SAN, an operation voltage VSS corresponding to a ground potential is applied to the common source line NCS. A stepped-down voltage VDL is applied to the common source line PCS, to which the sources of the P channel amplifiers MOSFET Q17 and Q18 are connected, by the P channel power switch MOSFET of the sense amplifier driving circuit SDV similarly provided in the intersection area.

In a pair of I/O nodes of the unit circuit USA of the sense amplifier, a precharging circuit (or equalizing circuit) is provided, which includes an equalizer MOSFET Q21 for short-circuiting a complimentary bit line, and switches MOSFET Q19 and Q20 for supplying half precharging voltages VBLR to complimentary bit lines. A common precharging (equalizing) signal BLEQ is supplied to gates of these MOSFET Q19 to Q21. A driver circuit for generating such a precharging signal BLEQ includes a CMOS inverter circuit provided in the intersection area. At a start of memory accessing, before a word line selection timing, the MOSFET Q19 to Q21 constituting the precharging circuit are switched at a high speed through inverter circuits dispersed in the intersection areas.

The unit circuit USA of the sense amplifier is connected to memory mat complimentary bit lines BL and BLB on the left side of the drawing by shared switches MOSFET Q11 and Q12, and to similar memory mat complimentary bits lines BL and BLB (not shown) on the right side of the drawing by shared switches MOSFET Q13 and Q14. Switches MOSFET Q22 and Q23 constitute a column switch circuit, which is tuned ON to connect the pair of I/O nodes of the unit circuit USA of the sense amplifier with a local I/O output line LIO when a column selection signal YS is set to a selection level (high level). In the sense amplifier portion, similar local I/O output lines LIOT0 and LIOB0 are provided.

The shared switching circuit maintains ON the left shared switches MOFSFET Q11 and Q12 by a high level of a signal SHL, and OFF the right shared switches MOSFET Q13 and Q14 by a low level of a signal SHR, for example when the memory mat word line WL of the left side is selected. Conversely, when the memory mat word line WL of the right side is selected, the shared switching circuit maintains ON the right shared switches MOSFET Q23 and Q24 of the sense amplifier, and OFF the left shared switches MOSFET Q11 and Q12. Thus, in the sense amplifier, signals of the memory mat complimentary bit lines BL and BLB of the selected side are amplified.

For example when the memory mat word line of the left side is selected, the connection of the I/O node of the sense amplifier (USA) to the left complimentary bit lines BL and BLB is maintained, and a very small signal of the memory cell connected to the selected word line WL is amplified, and supplied through the column switch circuits (Q12 and Q13) to the local I/O output line LIO. Though not shown, the local I/O output line is connected to a main I/O output line MIO connected to main and right amplifiers, not shown, through the CMOS switching circuit composed of the N channel MOSFET and the P channel MOSFET provide in the intersection area. This main I/O output line MIO is extended along the word driver WD in an extended direction of the bit line.

The word drivers WD provided in both sides of the memory mat MEMORY-MAT as shown in FIG. 3 are disposed b y being alternately dispersed in both ends of the word line WL. Accordingly, it is possible to match a pitch of the word lines WL arrayed at a high density corresponding to the disposition of the memory cell with a pitch of the word drivers including the P and N channel MOSFET Q1 and Q2 constituting the word drivers for driving the word lines. An operation voltage VPP corresponding to the boosted voltage VPP is supplied to an ON voltage VON, to which a source of the P channel MOSFET Q1.

A ground potential VSS or a substrate voltage VBB is supplied by the switching circuit CW to an OFF voltage VOFF, to which a source of the N channel MOSFET Q2 is connected. Corresponding to the embodiment of FIG. 2, a substrate voltage VBB1 may be supplied instead of the ground potential VSS; and a substrate voltage VBB2 for the substrate voltage VBB. Thus, the word driver WD switches to an unselection level of the word line WL, i.e., the OFF voltage VOFF to the ground potential VSS or the negative voltage VBB1, on a normal operation mode corresponding to an operation mode signal MODE, and to an unselection level of the word line WL, i.e., the OFF voltage VOFF to the ground potential VBB or the negative voltage VBB2 on a data holding mode.

Figure 5:
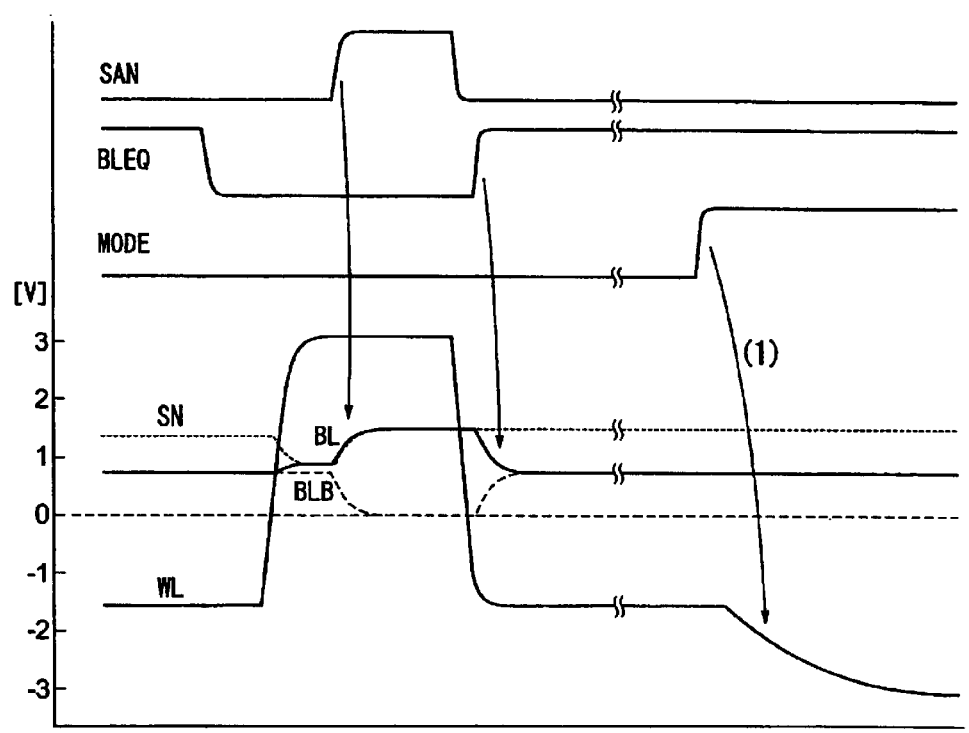
FIG. 5 is a wave form chart showing an example of an operation of the semiconductor memory of the present invention.
Figure 6:
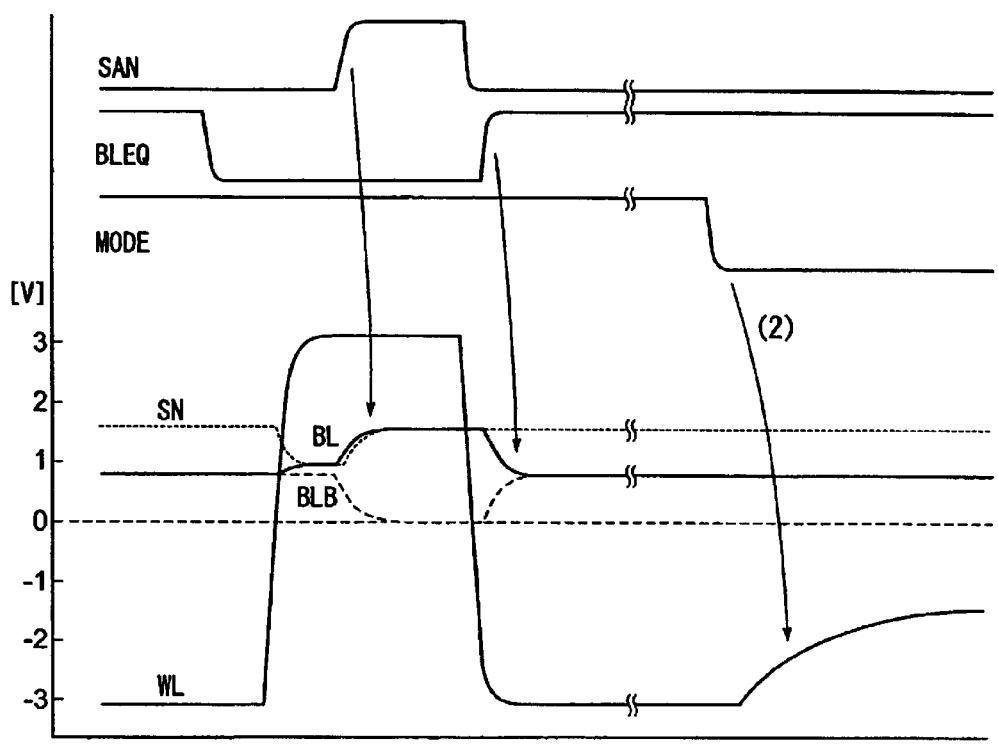
FIG. 6 is a wave form chart showing an example of an operation of the semiconductor memory of the present invention.

FIGS. 5 and 6 are wave form charts, each showing an example of an operation of the semiconductor memory of the present invention. This embodiment corresponds to the embodiment of FIG. 2. A normal operation mode is set when an operation mode signal MODE is at a low level. Because of a low level of a signal BLEQ, a precharging operation is finished, and the complimentary bit lines BL and BLB are maintained at equal precharged levels in floating states.

The word line WL is switched from about −1.5V corresponding to an OFF voltage VOFF (VBB1) on the normal operation mode to a high level of about 3V corresponding to an ON voltage VON (VPP). Thus, a FIELD transistor PD is turned ON, and the capacitor C is connected to the bit line BL. As shown, when a potential of a storage node SN is at a high level VDL, a charge corresponding to the voltage VDL and a charge generated by precharging of the bit line BL are shared and, thus, a potential of the bit line BL is changed to a high level, for example by a very small voltage, corresponding to a stored charge of the capacitor C.

A signal SAN is set to a high level (signal SAP is set to a low level, not shown) to activate the sense amplifier SA, a potential difference between the bit lines BLB and BL is amplified, and these bit lines are respectively amplified to a high level corresponding to the voltage VDL and a low level corresponding to the voltage VSS. The high level (VDL) of the amplified bit line BL is written again in the capacitor C by the PLED transistor PD of an ON state. In the case of a reading operation, an amplifying signal of the sense amplifier is sent through the column switch amplifier, the local I/O output line LIO, and the main I/O line MIO to the main amplifier, and amplified, and then outputted as a reading signal from the external terminal by the output circuit. In the case of a writing operation, potentials of the bit lines BL and BLB are decided corresponding to a writing signal, and then written in the capacitor C of the memory.

After the end of the reading/writing operation, the signal SAN is set to a low level (signal SAP to a high level) to stop the operation of the sense amplifier, the word line WL is set to a low level (VBB1) corresponding to an OFF voltage VOFF, and the PLED transistor PD is turned OFF. Then, a signal BLEQ is set to a high level, and the complimentary bit lines BL and BLB are short-circuited to return to half precharged levels.

When a data holding mode is set by the high level of an operation mode signal MODE, as indicated by (1), an OFF voltage of the word line WL is switched from VBB1 to a low voltage, e.g., VBB2. Accordingly, a reverse bias of −3V or the like is applied between the gate and the source of the PLED transistor PD to reduce a leakage current much more. Under the OFF voltage (VBB2) of the word line WL, only a refreshing operation similar to that shown in FIG. 6 is carried out. Low system selection of the refreshing operation is similar to that of the embodiment of FIG. 5. That is, the refreshing operation is carried out to read an information charge of the capacitor C, and amplify it to return to an original charge state, and equivalent to an omitted column system selection of the reading operation. When a normal mode is set by a low level of the operation mode signal MODE, as indicated by (2), the OFF voltage of the word line WL is switched from VBB2 to VBB1. Thus, the process returns to the state of FIG. 5, enabling writing/reading to be performed.

According to the embodiment, even on the normal operation mode, the OFF voltage VOFF of the word line WL is set to about −1.5V to realize a reverse bias state between the gate and the source of the PLED transistor. Thus, it is possible to reduce a leakage current even if a defect is present in a current channel as described above, and extend a refreshing cycle to compensate for a reduction in an information charge stored in the capacitor C caused by the leakage current.

When the OFF voltage VOFF of the word line WL is set to a ground potential VSS on the normal operation mode as in the case of the first embodiment of FIG. 1, compared with the embodiment of FIG. 2, the leakage current caused by the defect of the current channel as described above is increased in relative relation. Thus, the embodiment of FIG. 2 may be more advantageous if consideration is given only to the leakage current. However, in terms of overall consumption of power, both embodiments have the following advantages and disadvantages.

In the embodiment of FIG. 1, the consumption of current on the normal operation mode is increased as the refreshing cycle is shorter and the number of times of refreshing operations within a fixed period is larger compared with that of the embodiment of FIG. 2. However, on the normal operation mode, the original wiring/reading operation of the memory is carried out, during which the refreshing operation is carried out at a fixed cycle, and accordingly it is possible to prevent any apparent increases in the consumption of current.

In the embodiment of FIG. 2, to reduce the leakage current of the PLED transistor, in other words, to set the OFF voltage VOFF of the word line WL to the negative voltage so as to extend the refreshing cycle, the charge pump circuit is operated. Thus, the refreshing cycle is made longer, while the consumption of current in the charge pump circuit is increased. As a result, a reduction in the consumption of current by the longer refreshing cycle, and the increased consumption of current in the charge pump circuit cancel each other. Selection of one of these arrangements should be decided according to a system for loading such. For example, in the case of an electronic device driven by a battery, overall evaluation must be made as the consumption of current of an absolute value becomes a problem. In the case of a device where only the data holding mode is backed up by a battery, one having a smaller consumption of current only for the data holding mode may be selected.

Figure 7:
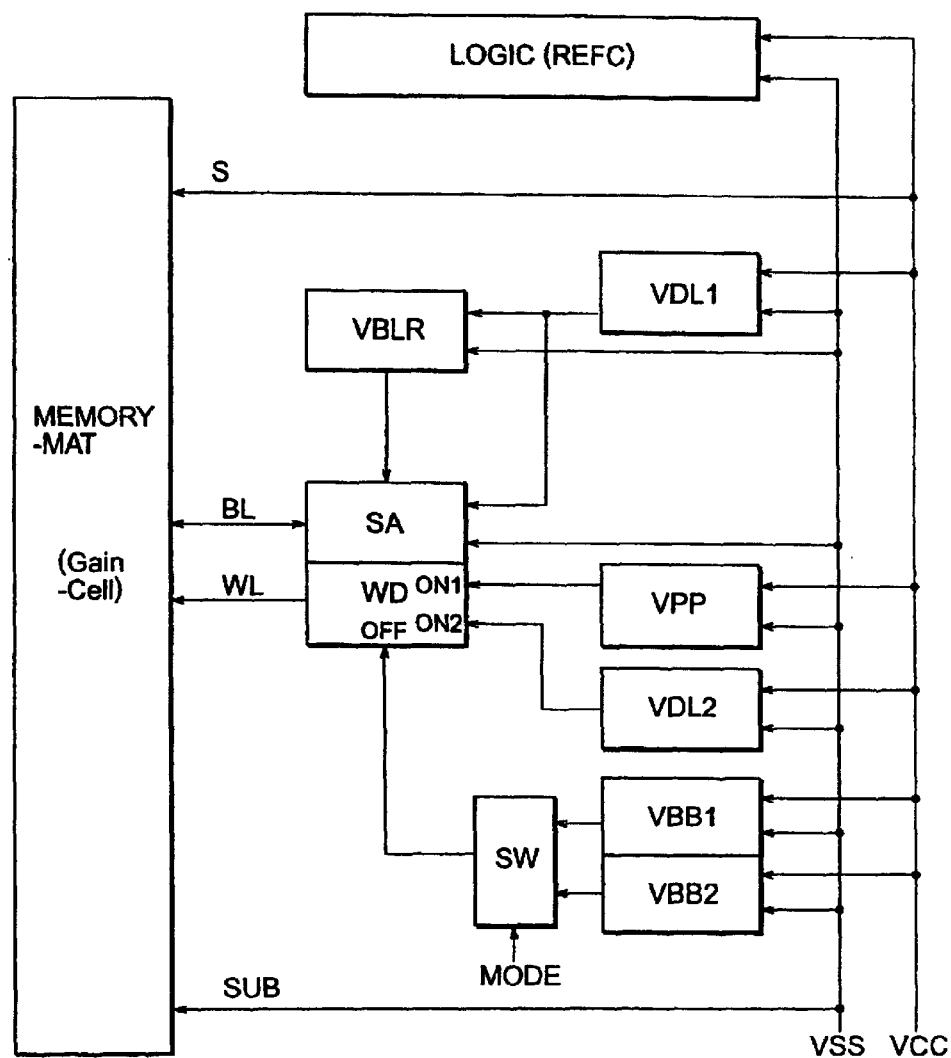
FIG. 7 is a schematic block diagram showing a semiconductor memory according to yet another embodiment of the present invention.

FIG. 7 is a schematic block diagram showing a semiconductor memory according to yet another embodiment of the present invention. In the embodiment, a gain cell (Gain-Cell) is used. Correspondingly, a word driver WD receives two ON voltages. That is, an ON voltage terminal ON1 for reading, and an ON voltage terminal ON2 for writing are provided. A stepped-down voltage VDL2 generated by a step-down circuit VLD2 is supplied to the ON voltage terminal ON1 for reading; and a boosted voltage VPP generated by a booster circuit VPP to the ON voltage terminal ON2 for writing.

An OFF voltage of a word line WL included in a memory cell and used for reducing a leakage current in an PLED transistor is switched between two OFF voltages, e.g., between VBB1 and VBB2 by a switching circuit SW, corresponding to an operation mode, and sent to the OFF voltage terminal OFF of the word driver WD. Other components are similar to those shown in FIGS. 1 and 2, and thus description thereof is omitted.

Figure 8:
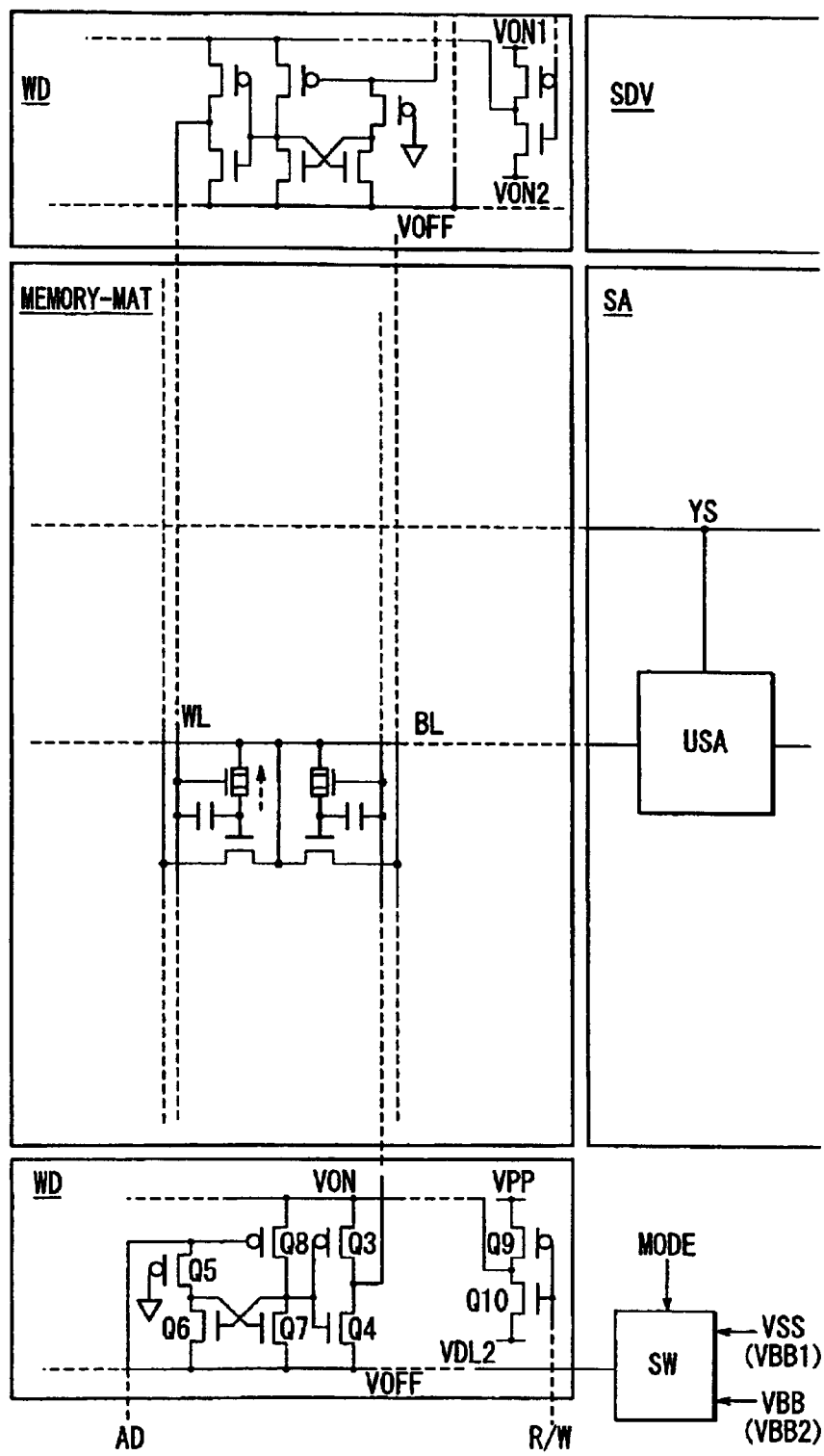
FIG. 8 is a circuit diagram showing an embodiment of a memory mat and its peripheral circuit of FIG. 7.
Figure 9:
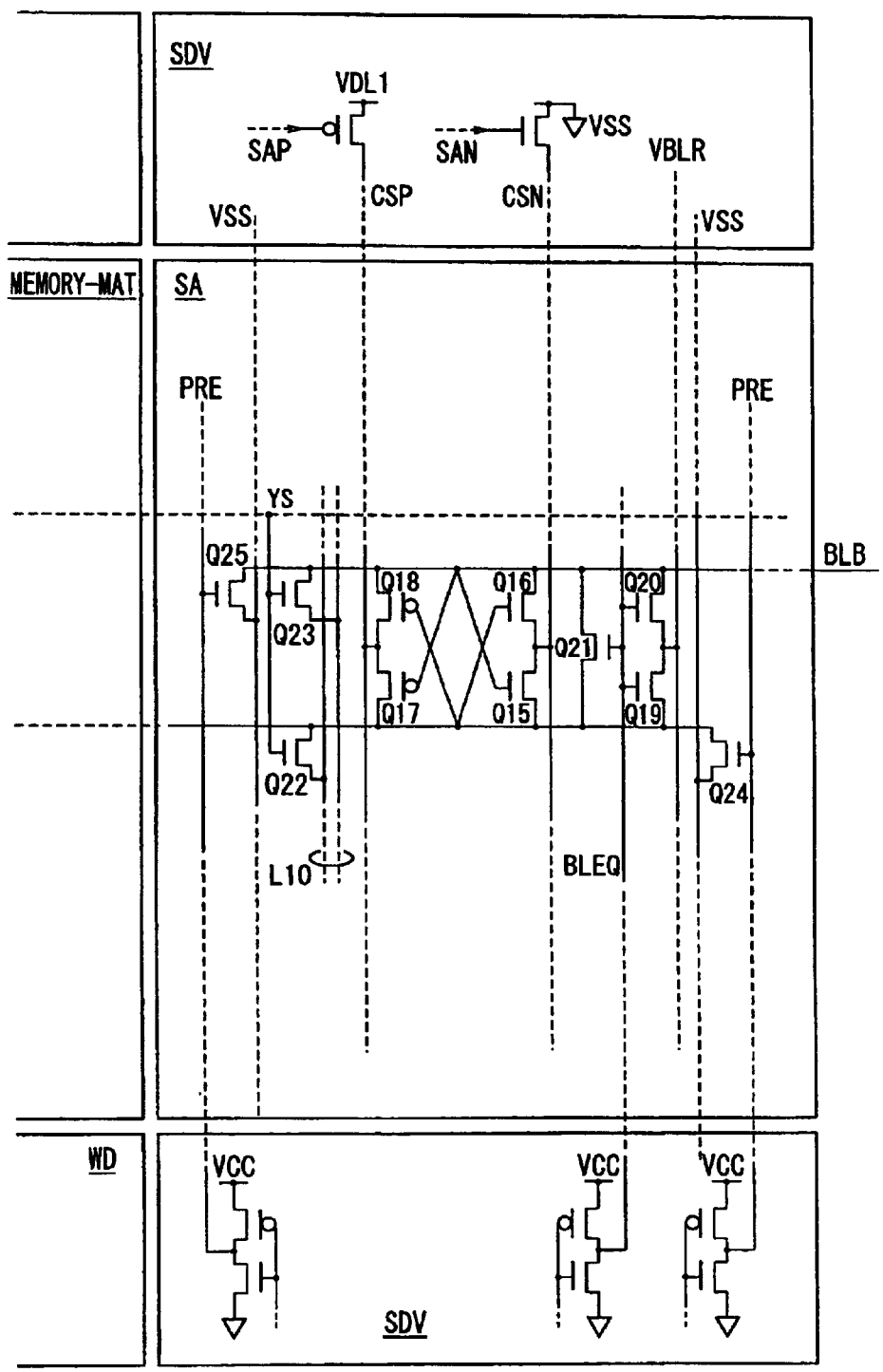
FIG. 9 is a circuit diagram showing an embodiment of the memory mat and its peripheral circuit of FIG. 7.

Each of FIGS. 8 and 9 is a circuit diagram showing an embodiment of a memory mat and its peripheral circuit of FIG. 7. This embodiment includes a memory cell portion, a word drive portion and a sense amplifier portion, which are partially different from those of the embodiment shown in FIG. 1 or 4. Accordingly, to avoid repeated explanation, only portions difference from those of the previous embodiments are described hereinafter.

As shown in FIG. 8, a memory cell is provided between word and bit lines WL and BL, and composed of a switching device PD including a PLED transistor, a capacitor C for storage, and an amplifier MOSFET Qm. A control terminal (gate) of the switching device PD is connected to the word line WL; a drain of the switching device to the bit line BL; one electrode of the capacitor C for storage to a source; and the other electrode of the capacitor C for storage to the word line WL. A source of the amplifier MOSFET Qm is connected to the bit line BL, and a-drain thereof receives a power supply voltage VCC to perform a source follower amplifying operation.

When a sense amplifier SA is operated by an internal stepped-down voltage VDL, a high level of the bit line BL (or BLB) amplified by the sense amplifier is set equal to a level of the internal voltage VDL. Accordingly, a high voltage VPP similar to the above is applied to the word line WL when the switching device PD is turned ON to write a potential of the bit line in the capacitor C, and this boosted voltage VPP is represented by VDL+Tth+α.

A word driver WD includes a function added to switch between a selection level (VPP) for writing in the capacitor C, where the switching device PD is turned ON, and a selection level (VDL2) for reading, where the switching device PD is OFF, and an information voltage held in the capacitor C is outputted from the source of the amplifier MOSFET to the bit line. That is, the boosted voltage VPP is supplied to a source of a P channel MOSFET Q9; and a stepped-down voltage VDL2 to a source of an N channel MOSFET Q10. Then, a control signal R/W is supplied to gates of the MOSFET Q9 and Q10, and an ON voltage VON of the word line WL is outputted from drains of the MOSFET Q9 and Q10. Specifically, when the signal R/W is at a high level, the N channel MOSFET Q10 is turned ON, and the ON voltage VON of the word line WL is set to a stepped-down voltage similar to VDL2. When the signal R/W is at a low level, the P channel MOSFET Q9 is turned OFF, and the ON voltage VON of the word line WL is set to a boosted voltage similar to VPP.

In the word driver WD, as in the foregoing case, to reduce a leakage current while the switching device PD is OFF, switching of an OFF Voltage VOFF is carried out corresponding to an operation mode in a manner similar to the foregoing embodiment.

In order to switch a selection level of the word line fro VDL2 to VPP under a selection signal AD of the same level, and an unselection level of the word line to VSS or VBB (VBB1 or VBB2), word driver WD includes a level conversion circuit composed of P channel MOSFET Q5 and Q8, and N channel MOSFET Q6 and Q7 of latch forms, and gate voltages of MOSFET Q3 and Q4 are generated to drive the word line WL.

Though not limited to such, in the embodiment, a so-called one intersection pint system is employed, where complimentary bit lines BL and BLB are extended in both sides around the sense amplifier. According to this one intersection point system, since the bit lines BL and BLS are directly connected to a pair of I/O nodes of a unit amplifier circuit of the sense amplifier, no shared switches MOSFET similar to that described above are provided. The unit amplifier circuit of the sense amplifier includes N channel amplifiers MOSFET Q15 and Q16, and P channel amplifiers MOSFET Q17 and Q18 similar to those described above. MOSFET Q22 and Q23 are also provided to constitute a column switch circuit similar to that described above. To obtain an amplifying signal from an amplifier MOSFET Qm of the memory cell, MOSFET Q24 and Q25 are provided in the bit lines BL and BLB for supplying precharging signals for reading.

As in the case of the foregoing embodiment, regarding an OFF voltage VOFF, to which a source of the N channel MOSFET 4 is connected, VBB1 or VBB2 (alternatively ground potential VSS or substrate voltage VBB) is supplied by a switching circuit SW. Accordingly, the word driver WD switches to an unselection level of the word line WL, i.e., the OFF voltage VOFF to the ground potential VSS or a negative voltage VBB1, on a normal operation corresponding to an operation signal MODE, and to an unselection level of the word line WL, i.e., the OFF voltage VOFF to the ground potential VSS or a negative voltage VBB2, on a data holding mode.

Figure 10:
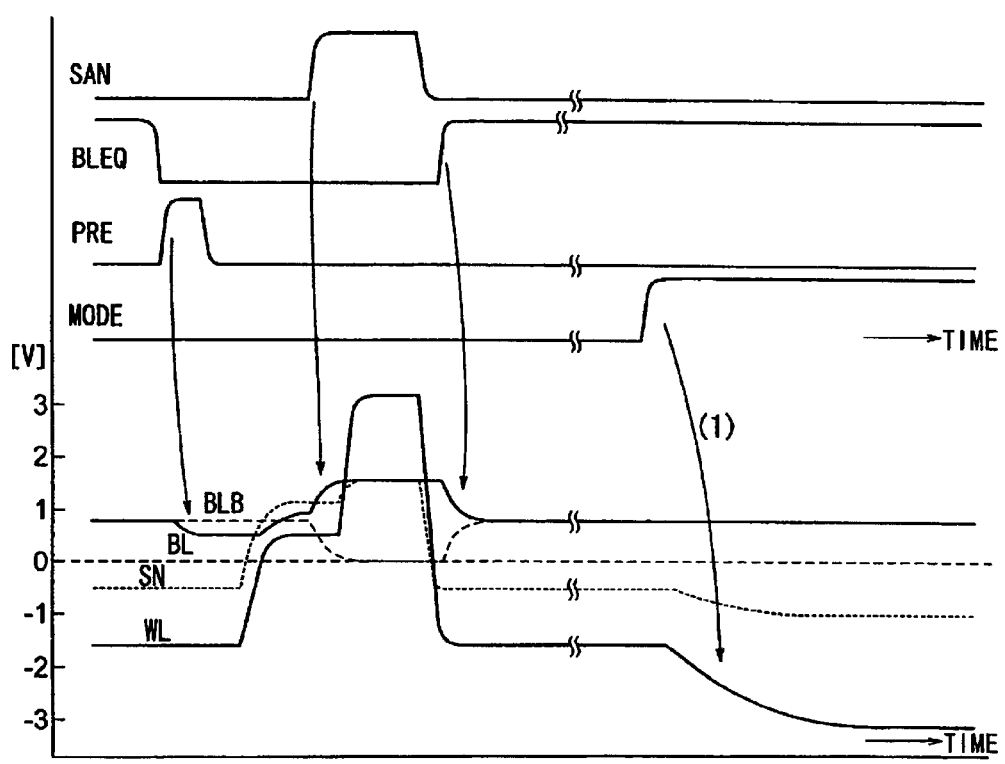
FIG. 10 is a wave form chart showing an example of an operation of the semiconductor memory of the present invention.
Figure 11:
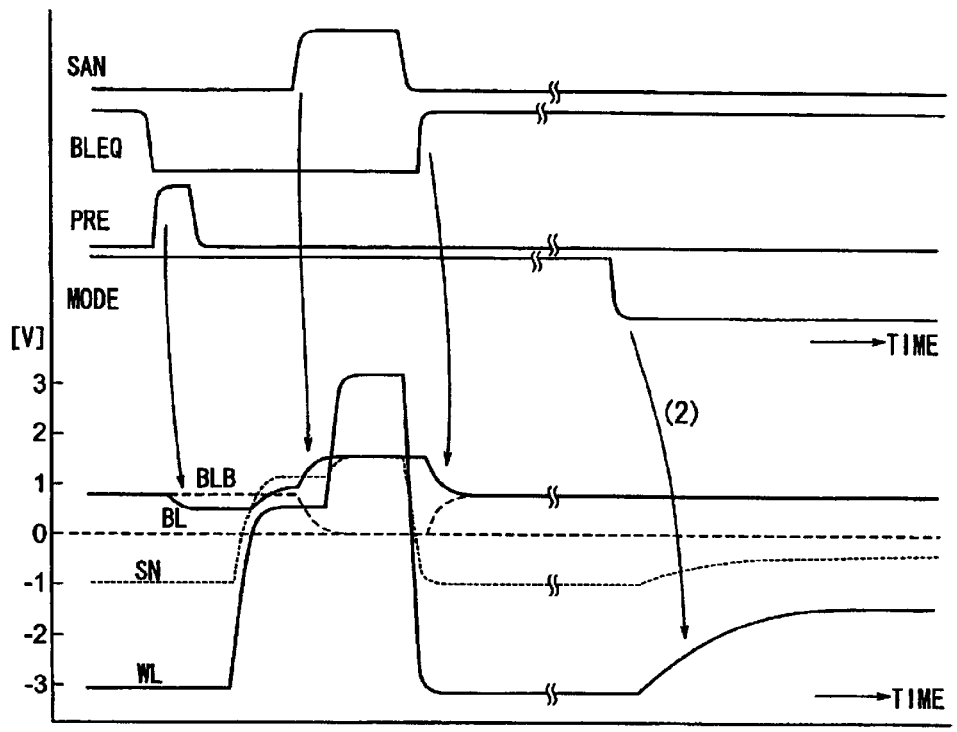
FIG. 11 is a wave form chart showing an example of an operation of the semiconductor memory of the present invention.

FIGS. 10 and 11 are wave form charts, each showing an example of an operation of the semiconductor memory of the present invention. This embodiment corresponds to the embodiment of FIG. 7. A normal operation mode is set when an operation mode signal MODE is at a low level. Because of a low level of a signal BLEQ, a precharging operation is finished, and the complimentary bit lines BL and BLB are maintained at equal precharged levels in floating states.

In the bit line BL in a side where the word line WL is selected, before a selection operation of the word line WL, a precharging signal PRE for reading is set to a high level to reduce a potential of the bit line BL. The word line WL is switched from about −1.5V corresponding to an OFF voltage VOFF (VBB1) on the normal operation mode to a high level of about 0.5V corresponding to an ON voltage VON (VDL 2). Thus, a potential of a storage node SN is set high by superposition of the selection level (0.5V) of the word line WL on high-level voltages stored in both ends of the capacitor C. Corresponding to a gate voltage of the amplifier MOSFET Qm, a potential of the bit line BL connected to the source is set higher than a precharging voltage of the bit line BLB. If a charge of the capacitor C is zero, corresponding to the gate voltage (VDL 2) of the amplifier MOSFET Qm, a potential of the bit line BL connected to the source is set lower than the precharging voltage of the bit line BLB.

Respective voltages are set such that a voltage obtained by subtracting a threshold voltage Vth of the amplifier MOSFET Qm from a voltage (VDL 2+VDL 1) obtained by adding a high-level voltage VH (VDL 1) stored in the capacitor C and the selection level (VDL 2) of the word line WL can be higher than the precharging voltage (VBLR) of the bit line BLB, a voltage obtained by subtracting the threshold voltage Vth of the amplifier MOSFET Qm from a voltage (VDL 2+0V) obtained by adding a low-level voltage VL (0V) stored in the capacitor C and the selection level (VDL 2) of the word line WL can be higher than the precharging voltage (VBLR) of the bit line BLB, and the LED transistor can be turned OFF under the voltage VDL 2 of the word line WL.

A signal SAN is set to a high level (signal SAP is set to a low level, not shown) to activate the sense amplifier SA, a potential difference between the bit lines BLB and BL is amplified, and these bit lines are respectively amplified to a high level corresponding to the voltage VDL and a low level corresponding to the voltage VSS. Though not limited to such, the high level (VDL) of the amplified bit line BL is written again in the capacitor C by setting the word line WL to a high level corresponding to a boosted voltage VPP, and turning ON the PLED transistor PD. As in the embodiment shown in FIG. 1 or 2, it is not always necessary to carry out such rewriting in the capacitor C during a reading operation. In other words, since an information charge of the capacitor C is lost during the reading operation, an OFF voltage may be directly supplied to the word line WL.

However, according to the present invention, it is assumed that a leakage current generated by a defect of the PLED transistor cannot be ignored, in other words, a refreshing operation must be carried out. Thus, rewriting in the capacitor C is carried out even during the reading operation as in the case of the foregoing embodiment. In the case of a reading operation, an amplifying signal of the sense amplifier is sent through the column switch amplifier, the local I/O output line LIO, and the main I/O line MIO to the main amplifier, and amplified, and then outputted as a reading signal from the external terminal by the output circuit. In the case of a writing operation, potentials of the bit lines BL and BLB are decided corresponding to a writing signal, and then written in the capacitor C of the memory.

After the end of the reading/writing operation, the signal SAN is set to a low level (signal SAP to a high level) to stop the operation of the sense amplifier, the word line WL is set to a low level (VBB1) corresponding to an OFF voltage VOFF, and the PLED transistor PD is turned OFF. Then, a signal BLEQ is set to a high level, and the complimentary bit lines BL and BLB are short-circuited to return to half precharged levels.

When a data holding mode is set by the high level of an operation mode signal MODE, as indicated by (1), an OFF voltage of the word line WL is switched from VBB1 to a low voltage, e.g., VBB2. Accordingly, a reverse bias of −3V or the like is applied between the gate and the source of the PLED transistor PD to reduce a leakage current much more. Under the OFF voltage (VBB2) of the word line WL, only a refreshing operation similar to that shown in FIG. 11 is carried out. Low system selection of the refreshing operation is similar to that of the embodiment of FIG. 10.

That is, the refreshing operation is carried out to read an information charge of the capacitor C, and amplify it, thereby return the stored charge reduced by the leakage current to an original charge state, and equivalent to an omitted column system selection of the reading operation in the foregoing embodiment. When a normal mode is set by a low level of the operation mode signal MODE, as indicated by (2), the OFF voltage of the word line WL is switched from VBB2 to VBB1. Thus, the process returns to the state of FIG. 10, enabling writing/reading to be performed.

Also according to this embodiment, even on the normal operation mode, the OFF voltage VOFF of the word line WL is set to about −1.5V to realize a reverse bias state between the gate and the source of the PLED transistor. Thus, it is possible to reduce a leakage current even if a defect is present in a current channel as described above, and extend a refreshing cycle to compensate for a reduction in an information charge stored in the capacitor C caused by the leakage current. To reduce the leakage current by applying a reverse bias between the gate and the source of the PLED transistor only on the data holding mode, the OFF voltage VOFF of the word line WL may be set to 0V, i.e., a ground potential VSS, on the normal operation mode.

Figure 12A:
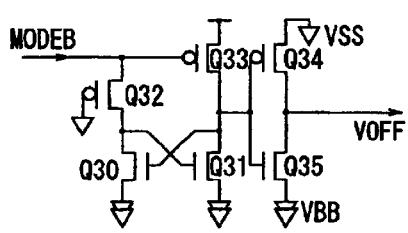
FIGS. 12A and 12B are circuit diagrams, each showing an embodiment of a switching circuit of FIG. 1.
Figure 12B:
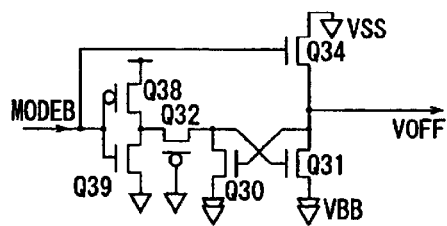

FIGS. 12A and 12B are circuit diagrams, each showing an embodiment of a switching circuit of FIG. 1. The switching circuit of FIG. 12A includes a level conversion circuit provided in an input portion to output either a ground potential VSS or a negative voltage VBB corresponding to a normal signal level of a signal MODEB. The signal MODEB is supplied to a gate of a P channel MOSFET Q33, and a source of a P channel MOSFET Q32. A power supply voltage VSS is supplied to a source of the MOSFET 33; and the ground potential VSS of the circuit to a gate of the MOSFET Q32.

Drains of N channel MOSFET Q30 and Q31 latched by intersecting and connecting gates and drains are connected to drains of the P channel MOSFET Q32 and Q33. The negative voltage VBB is supplied to sources of these MOSFET Q30 and Q31. A level-converted output is made from a commonly connected drain of the MOSFET Q33 and Q31, and sent to a gate of a P channel MOSFET Q34 for outputting the ground potential VSS. The level-converted output is used as a signal for driving an N channel MOSFET Q35 for outputting a voltage VBB2.

If the signal MODEB is at a high level similar to, e.g., the voltage VCC, the P channel MOSFET Q33 is turned OFF, while the P channel MOSFET Q32 is turned ON. Accordingly, the MOSFET Q31 receives a high-level signal MODE at its gate through the MOSFET Q32 to be turned ON. The ON state of the MOSFET Q31 sets potentials of the gate and the source of the MOSFET Q30 equal to that of the voltage VBB, thus turning ON the MOSFET Q30. By the ON state of the MOSFET Q31, an output signal is set to a low level similar to that of the voltage VBB. Thus, an N channel output MOSFET Q34 is turned OFF. By a low-level output signal of the level conversion circuit, the P channel MOSFET Q34 is turned ON to output an OFF voltage VOFF similar to the ground potential VSS.

If the signal MODEB is at a low level similar to, e.g., the ground potential VSS, then the P channel MOSFET Q33 is turned ON, while the P channel MOSFET Q32 is turned OFF. Accordingly, the MOSFET Q30 receives a high-level power supply voltage VCC at its gate-through the MOSFET Q33 to be turned ON. The ON state of the MOSFET Q30 sets potentials of the gate and the source of the MOSFET Q31 equal to that of the voltage VBB2, thus turning OFF the MOSFET Q31. By the ON state of the MOSFET Q33, an output signal is set to a high level similar to that of the voltage VCC. Thus, the N channel output MOSFET Q34 is turned ON, and the voltage VBB is outputted as an OFF voltage VOFF. By a low-level output signal of the level conversion circuit, the P channel MOSFET Q34 is turned OFF.

The switching circuit of FIG. 12B includes an output MOSFET Q34 of an N channel type. Thus, a signal MODEB is directly supplied to a gate of the MOSFET Q34. This signal MODEB is inverted by a CMOS inverter circuit composed of MOSFET Q38 and Q39, and sent to a level conversion circuit composed of MOSFET Q32 and Q31 similar to the foregoing. In the embodiment, the MOSFET Q31 operates both to convert a level, and output a voltage VBB.

Figure 13:
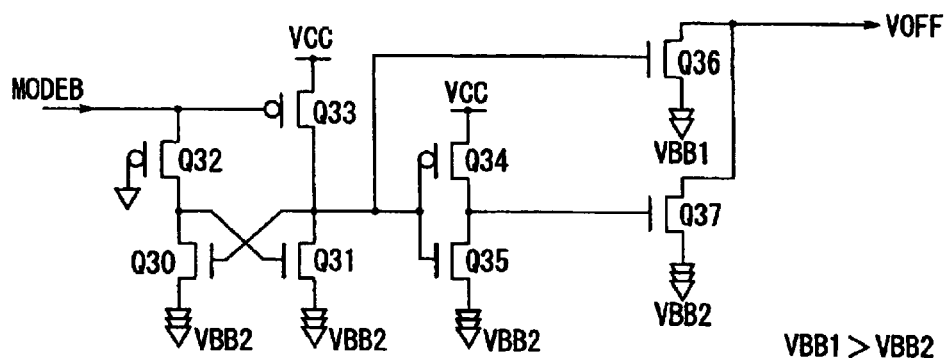
FIG. 13 is a circuit diagram showing an embodiment of a switching circuit of FIG. 2 or 7.

FIG. 13 is a circuit diagram showing an embodiment of a switching circuit of FIG. 2 or 7. According to the embodiment, the switching circuit includes a level conversion circuit similar to the foregoing provided in an input portion to output either a negative voltage VBB1 or VBB2 corresponding to a normal signal level of a signal MODEB. That is, the signal MODEB is supplied to a gate of a P channel MOSFET Q33, and a source of a P channel MOSFET Q32. A power supply voltage VSS is supplied to a source of the MOSFET 33; and a ground potential VSS of the circuit to a gate of the MOSFET Q32.

Drains of N channel MOSFET Q30 and Q31 latched by intersecting and connecting gates and drains are connected to drains of the P channel MOSFET Q32 and Q33. The negative voltage VBB2 as a lowest voltage is supplied to sources of these MOSFET Q30 and Q31. As described above, the voltage VBB1 is set to, e.g., −1.5V, the voltage VBB2 to, e.g., 03V, and a relation is represented by VBB1>VBB2.

A level-converted output is made from a commonly connected drain of the MOSFET Q33 and Q31, and sent to a gate of an N channel MOSFET Q36 for outputting the voltage VBB1. The level-converted output is sent to a CMOS inverter circuit composed a P channel MOSFET Q34 and an N channel MOSFET Q35 operated by the power supply voltage VCC and the negative voltage VBB2, and an inversion signal having signal amplitude similar to that of VCC-VBB2 is generated from its output. By this inversion signal, an N channel MOSFET Q37 for outputting a voltage VBB2 is driven.

If the signal MODEB is at a high level similar to, e.g., the voltage VCC, the P channel MOSFET Q33 is turned OFF, while the P channel MOSFET Q32 is turned ON. Accordingly, the MOSFET Q31 receives a high-level signal MODE at its gate through the MOSFET Q32 to be turned ON. The ON state of the MOSFET Q31 sets potentials of the gate and the source of the MOSFET Q30 equal to that of the voltage VBB2, thus turning ON the MOSFET Q30. By the ON state of the MOSFET Q31, an output signal is set to a low level similar to that of the voltage VBB2. Thus, an N channel output MOSFET Q36 is turned OFF. By a low-level output signal of the level conversion circuit, an output signal of the CMOS inverter circuit composed of the P channel MOSFET Q34 and the N channel MOSFET Q35 is set to a high level. Thus, an N channel MOSFET is turned ON to output an OFF voltage VOFF similar to the voltage VBB2.

If the signal MODEB is at a low level similar to, e.g., the ground potential VSS, then the P channel MOSFET Q33 is turned ON, while the P channel MOSFET Q32 is turned OFF. Accordingly, the MOSFET Q30 receives a high-level power supply voltage VCC at its gate through the MOSFET Q33 to be turned ON. The ON state of the MOSFET Q30 sets potentials of the gate and the source of the MOSFET Q31 equal to that of the voltage VBB2, thus turning OFF the MOSFET Q31. By the ON state of the MOSFET Q33, an output signal is set to a high level similar to that of the voltage VCC. Thus, the N channel output MOSFET Q36 is turned ON, and the voltage VBB1 is outputted as an OFF voltage VOFF. By a low-level output signal of the level conversion circuit, an output signal of the CMOS inverter circuit composed of the P channel MOSFET Q34 and the N channel MOSFET Q35 is set to a level similar to that of the voltage VBB2, and thus the N channel MOSFET Q37 is turned OFF.

Figure 14:
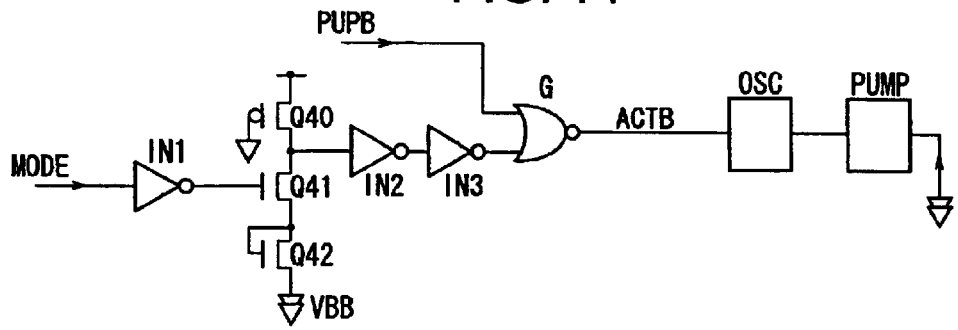
FIG. 14 is a block diagram showing an embodiment of a negative voltage generation circuit of the present invention.

FIG. 14 is a block diagram showing an embodiment of a negative voltage generation circuit of the present invention. In the embodiment, a negative voltage VBB generated by the negative voltage generation circuit itself is changed according to an operation mode. The negative voltage generation circuit generates the negative voltage VBB by a charge pump circuit PUMP, which receives a pulse generated by an oscillation circuit OSC. The oscillation circuit performs an oscillation operation when a signal ACTB is set to a low level (logic 0), and stops the oscillation operation when the signal ACTB is set to a high level. By such operation control of the oscillation circuit, the charge pump circuit PUMP is intermittently operated to control a substrate voltage VBB.

A signal PUPB is used to control an operation of the negative voltage generation circuit, and instruct a negative voltage generation operation at its low level. A P channel MOSFET Q 40 operates as a high resistance device, and a diode-connected N channel MOSFET Q41 and an N channel MOSFET Q42 constitute a level detection circuit of a negative voltage VBB. This MOSFET Q41 is controlled by an output signal of a CMOS inverter circuit, which receives an operation mode signal MODE.

When the operation mode signal MODE is at a low level, the output signal of the CMOS inverter circuit IN1 is set to a high level, the MOSFETQ41 is turned ON, and rains of the diode-connected MOSFET Q41 and the MOSFET Q40 are connected to each other. On such an operation mode, when a negative voltage VBB is set low, equal to a voltage between a gate and a source of the MOSFET Q32, a current channel is formed, and an input voltage VM of a CMOS inverter circuit IN2 is set to a low level. Accordingly, an output signal of the CMOS inverter circuit IN2 is set to a high level, and an output signal of a CMOS inverter circuit IN3 to a low level (logic 0), setting an output signal of a NOR gate G1 to a high level (logic 1). Thus, the operation of the oscillation circuit OSC is stopped.

When the stop of the charge pump circuit PUMP causes the negative voltage VBB to be smaller than the voltage between the gate and the source of the MOSFET Q32, the current channel is shut off, an input signal VM of the CMOS inverter circuit IN2 is set to a high level by the MOSFET Q40 as a high resistance device, the output signals of the CMOS inverter circuits IN2 and IN3 are respectively set to a high level and a low level (logic 1), and the output signal of the NOR gate circuit G1 is set to a low level (logic 0). Thus, the oscillation circuit OSC is operated to generate a negative voltage by the charge pump circuit PUMP. By such intermittent operations of the oscillation circuit OSC and the charge pump circuit PUMP, the negative voltage VBB is controlled to be substantially constant corresponding to a threshold voltage of the MOSFET Q42.

When the operation mode signal MODE is at a low level, the output signal of the CMOS inverter circuit IN1 is set to a low level, and the MOSFET Q41 is considered equivalent to a diode-connected MOSFET. On such an operation mode, when a negative voltage VBB is set smaller than a voltage between the gate and the source of the MOSFET Q32 and Q41, the MOSFET Q41 and Q42 are turned ON to form a current channel, and a voltage VM is set to a low level. Thus, since the operation of the Oscillation circuit OSC is stopped, the negative voltage VBB is controlled to be substantially constant corresponding to a threshold voltage of the MOSFET Q41 and Q42. As a result, without providing any switching circuits SW, it is possible to generate two negative voltages VBB1 (−Vth), and VBB2 (−2Vth) by the negative voltage generation circuit itself.

Figure 15:
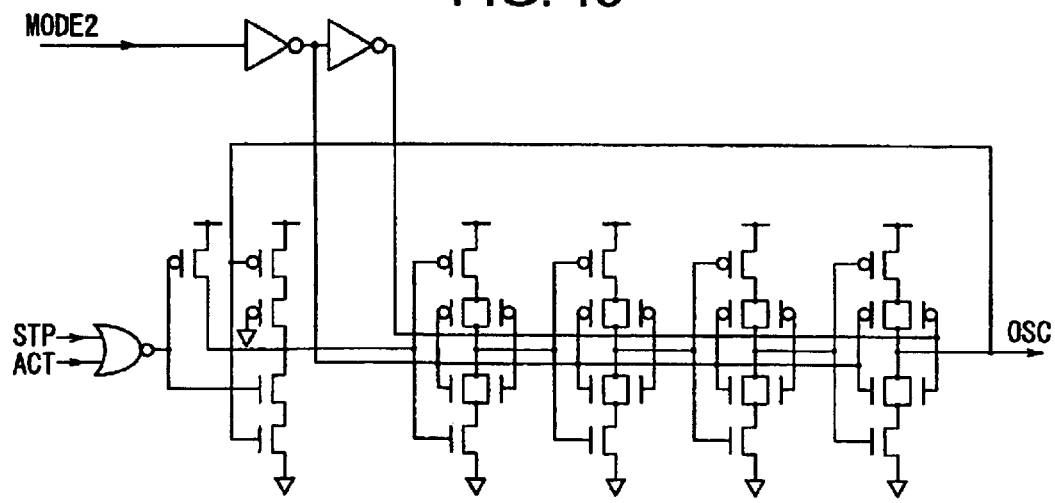
FIG. 15 is a circuit diagram showing an embodiment of an oscillation circuit of the present invention.

FIG. 15 is a circuit diagram showing an embodiment of an oscillation circuit of the present invention. According to the embodiment, on a data holding mode, as described above, a current supplying capability of a negative voltage generation circuit can be lower compared with that of the normal operation and, thus, consumption of power is somehow reduced in the negative voltage generation circuit itself. In the embodiment, for the above reason, an oscillation frequency of the oscillation circuit is changed between the normal mode and the data holding mode.

With regard to the oscillation circuit OSC, basically an odd number (five in the drawing) of CMOS inverter circuits are connected in a ring shape to constitute a ring oscillator. An initial-stage circuit of this ring oscillator is a double-input NAND gate circuit. By supplying a control signal generated by an OR gate circuit for receiving signals STP and ACT to one input, and controlling signal transmission at the NAND gate circuit corresponding to a level monitor output similar to that described above, formation/cutting-off of an oscillation loop is controlled.

Two kinds of MOSFET for switching operation currents are provided in the CMOS inverter circuit excluding the NAND gate circuit. That is, a pair of N and P channel MOSFET for supplying a large current by increasing a size, and a pair of N and P channel MOSFET for supplying only a small current by reducing a size are provided in parallel. Either one of these pairs is turned ON based on an operation mode signal MODE 2.

Thus, when the oscillation circuit performs its oscillation operation by the signals STP and ACT, on a normal operation mode, the MOSFET pair for supplying a large current is selected based on the operation mode signal MODE 2, and a signal delay time in the CMOS inverter circuit is shortened to increase an oscillation frequency of the oscillation circuit. Accordingly, the number of times of charge pumping per unit time at the charge pump circuit is increased to enhance the current supplying capability of the negative voltage generation circuit. On a data holding mode, the MOSFET pair for supplying a small current is selected based on the operation mode signal MODE 2, and a signal delay time in the CMOS inverter circuit is extended to reduce an oscillation frequency of the oscillation circuit. Thus, the number of times of charge pumping per unit time at the charge pump circuit is reduced, the current supplying capability of the negative voltage generation circuit is reduced corresponding to execution of only a refreshing operation at a long cycle, and consumption of current in the negative voltage generation circuit is also reduced.

Figure 16:
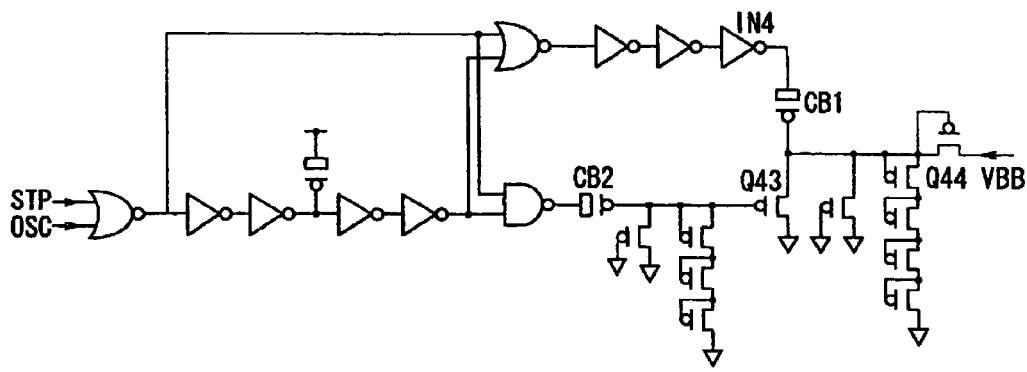
FIG. 16 is a circuit diagram showing an embodiment of a charge pump circuit of the present invention.

FIG. 16 is a circuit diagram showing an embodiment of a charge pump circuit of the present invention. According to the embodiment, as a MOSFET for precharging a boost capacitor CB1 for generating a negative voltage VBB, a P channel MOSFET Q43 is used, and a negative voltage generated by a boost capacitor CB2 is supplied to a gate thereof. Accordingly, both electrodes of the boost capacitor CB1a receive a high-level output signal of an inverter circuit IN4 corresponding to a power supply voltage (e.g., VCC), and a ground potential VSS of a circuit to be precharged. Thus, when the inverter circuit IN4 is at a low level (ground potential VSS), a negative voltage, e.g., −VCC, can be generated. By such negative voltage −VCC, a diode-type MOSFET Q44 is turned ON, and the voltage VBB is reduced to −VCC+Vth (Vth denotes a threshold voltage of MOSFET Q44).

The signal STP is an operation stopping signal. When this signal STP is at a high level (logic 1), a charge pump operation is stopped even in a state where an oscillation pulse is supplied form the oscillation circuit OSC. Even When the signal STP is at a low level (logic 0), an operation of the charge pump circuit is stopped if the operation of the oscillation circuit OSC is stopped by the level detection circuit.

Figure 17:
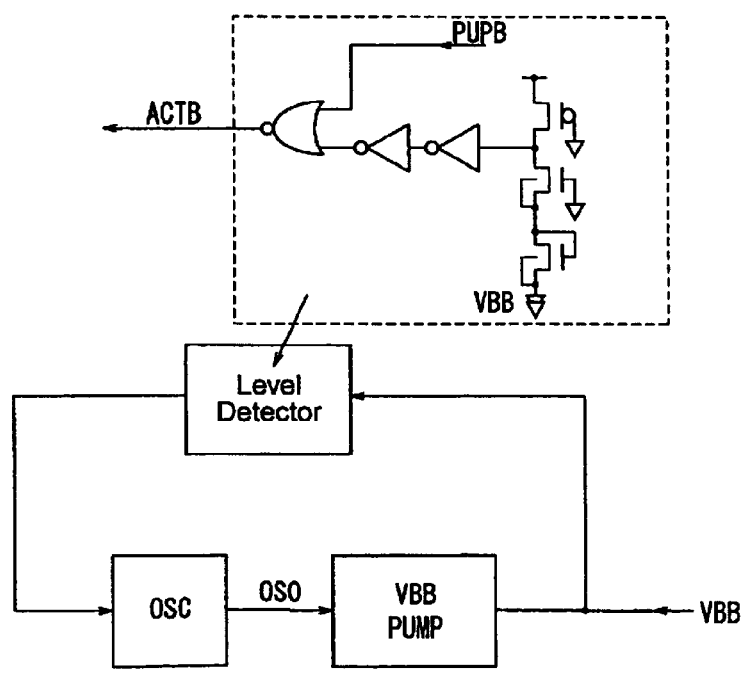
FIG. 17 is a block diagram showing another embodiment of a negative voltage generation circuit of the present invention.

FIG. 17 is a block diagram showing another embodiment of a negative voltage generation circuit of the present invention. An oscillation pulse generated by an oscillation circuit OSC is supplied to a charge pump circuit VBB-PUMP to generate a negative voltage VBB. The oscillation circuit OSC is composed of, e.g., a ring oscillator similar to that of FIG. 15. The charge pump circuit VBB-PUMP is compose of a circuit similar to that of FIG. 16. The negative voltage VBB is subjected to level determination by a level detection circuit (level detector), and an operation control signal ACTB is generated for the oscillation circuit OSC.

The level detection circuit includes a high resistance P channel MOSFET, a MOSFET having its gate connected to a ground potential, and a diode-connected MOSFET. This level detection circuit is equivalent to the circuit of the embodiment shown in FIG. 14, one when the output signal of the inverter circuit IN1 is at a low level. Accordingly, in a negative voltage generation circuit of the embodiment, a negative voltage VBB is set equal to −2Vt: Vth denotes a threshold value of the MOSFET.

As shown in FIG. 2 or 7, when two kinds of negative voltages, VBB1 and VBB2, are necessary, a level detection circuit of −2Vth (or −Vth) is used for a negative voltage generation circuit for generating VBB1; and a level detection circuit of −4Vth (or −2Vth) for a negative voltage generation circuit for generating VBB2.

In the embodiment of FIG. 15 or 16, when the normal mode is switched to the data holding mode, or vice versa, the negative voltage generation circuit for generating the voltage VBB2 is stopped by the signal STP on the normal mode and, when the mode is switched to the data holding mode, the voltage VBB2 is made operative, and the negative voltage generation circuit for generating the voltage VBB1 is stopped. Then, when the data holding mode is switched to the normal mode, the voltage VBB1 is made operative, and the negative voltage generation circuit for generating the voltage VBB2 is stopped. By alternately operating the two negative voltage generation circuits for generating the voltages VBB1 and VBB2 as described above, consumption of current can be reduced in each of the negative voltage generation circuits.

Figure 18:
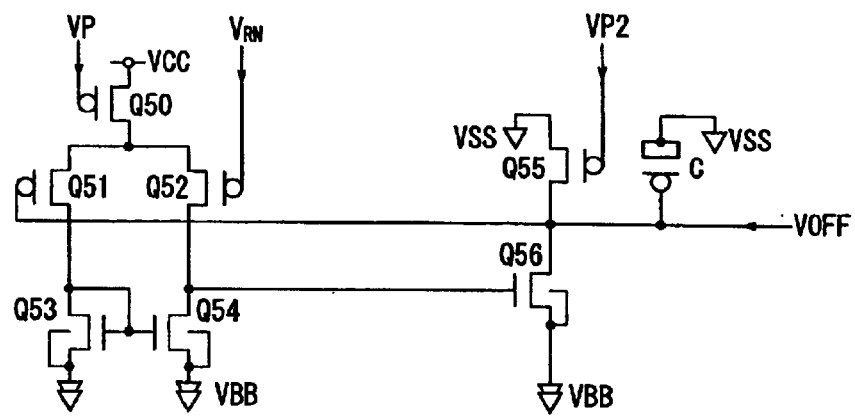
FIG. 18 is a circuit diagrams showing another embodiment of a switching circuit of FIGS. 2 or 7.

FIG. 18 is a circuit diagram showing another embodiment of a switching circuit of FIG. 2 or 7. According to the embodiment, the switching circuit is designed to change a signal voltage (OFF voltage) VOFF following a control voltage $V_{RN}$ by using P channel differential MOSFET Q51 and Q52, N channel current mirror load MOSFET Q53 and Q54, and a differential circuit (voltage comparison circuit) provided in a commonly connected source of the differential MOSFET Q51 and Q52, and composed of a P channel MOSFET Q50 for supplying a bias current. That is, at a ground potential VSS of an output point circuit for outputting an output voltage VOFF, a P channel MOSFET Q54 is provided, and operated as a high resistance device by applying a constant voltage VP2 thereto. An N channel MOSFET Q56 is provided between the output point for outputting the output voltage VOFF and a negative voltage VBB, and controlled based on an output signal of the voltage comparison circuit.

In the circuit of the embodiment, the output voltage VOFF following the control voltage $V_{RN}$ can be generated. That is, when the output voltage VOFF is lower than the control voltage $V_{RN}$, a relatively larger current is supplied to the MOSFET Q51 and, by the load circuit, a gate voltage of the MOSFET Q56 is reduced by a current corresponding to a difference in drain currents between the MOSFET Q51 and Q52. Accordingly, a current supplying capability of the MOSFET Q56 is reduced. As a result, the output voltage VOFF is increased by a current or the like of the word driver WD or the like.

When the output voltage VOFF is higher than the control voltage $V_{RN}$, a relatively larger current is supplied to the MOSFET Q52 and, by the load circuit, a gate voltage of the MOSFET Q56 is increased by a current corresponding to a difference in drain currents between the MOSFET Q51 and Q52. Accordingly, a current supplying capability of the MOSFET Q56 is increased. As a result, the output voltage VOFF is reduced toward the negative voltage VBB. By the foregoing control operation, the output voltage VOFF is controlled to be equal to the control voltage $V_{RN}$. By using such a circuit operation to switch the control voltage VRN to binary voltages corresponding to voltages VBB1 and VBB2, the two negative voltages VBB1 and VBB2 similar to those of the embodiment of FIG. 13 can be switched and outputted.

Figure 19:
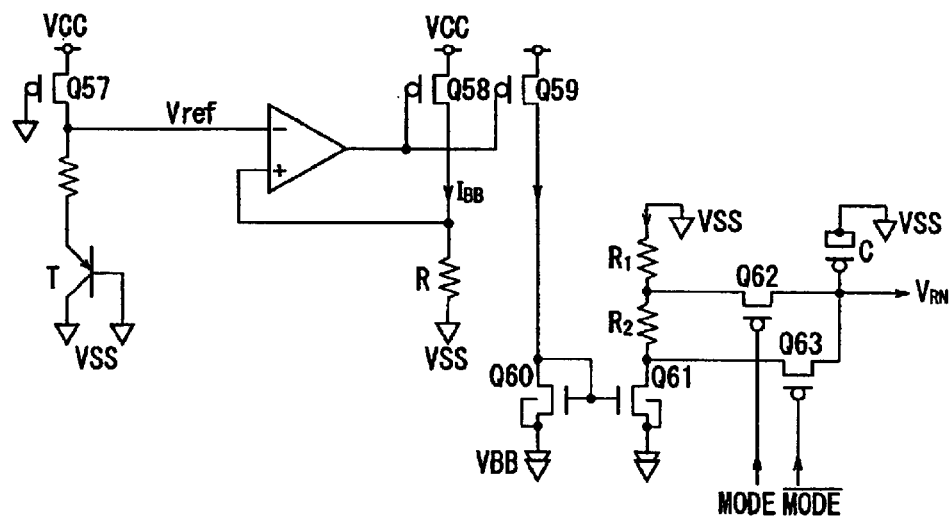
FIG. 19 is a wave form chart showing an embodiment of a control voltage generation circuit used for the circuit of FIG. 18.

FIG. 19 is a circuit diagram showing an embodiment of a control voltage generation circuit. According to the embodiment, the circuit generates the control voltage $V_{RN}$ of FIG. 18. A source and a drain of P types constituting a P channel MOSFET are set emitters, an N type well as a base and, by using a base of a parasitic bipolar transistor using a P substrate as a collector, an a voltage $V_{BE}$ between the emitters, a constant voltage device is constituted, and a constant voltage $V_{ref}$ thereof is supplied to an inversion input (−) of a voltage comparison circuit. A voltage generated by supplying a current $I_{BB}$ to a resistor R is applied to a non-inversion input (+) of the voltage comparison circuit. The voltage comparison circuit generates a constant current IBB by controlling non-MOSFET Q58 and A59 so as to set a voltage $V_{ref} = R \times I_{BB}$.

The constant current IBB is supplied through a current mirror circuit composed of the MOSFET Q59 and N channel MOSFET Q60 and Q61 to a series circuit of resistors $R_1$ and $R_2$. Voltage stepping-down in the resistors $R_1$ and $R_2$ results in generation of two reference voltages. These reference voltages are outputted as control voltages $V_{RN}$ through P channel MOSFET Q62 and Q63 controlled to be switched complimentarily by an operation mode signal MODE and its inversion signal /MODE. That is, when the operation mode signal MODE is at a low level, the P channel MOSFET Q62 is turned ON to output a control voltage $V_{RN}$ corresponding to a voltage VBB1. When the inversion operation mode signal /MODE is at a low level, the P channel MOSFET Q63 is turned ON to output control voltage $V_{RN}$ corresponding to a voltage VBB2.

Figure 20A:
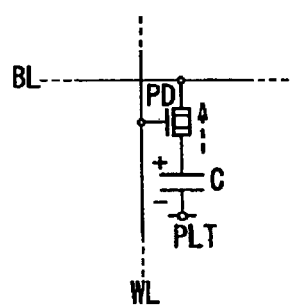
FIGS. 20A to 20C are equivalent circuit and structure sectional views, each showing an embodiment of a memory cell corresponding to the embodiment of FIG. 3.
Figure 20B:
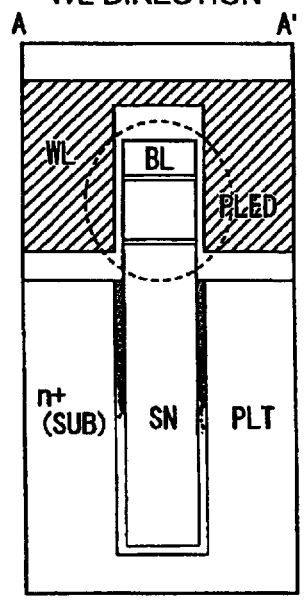
Figure 20C:
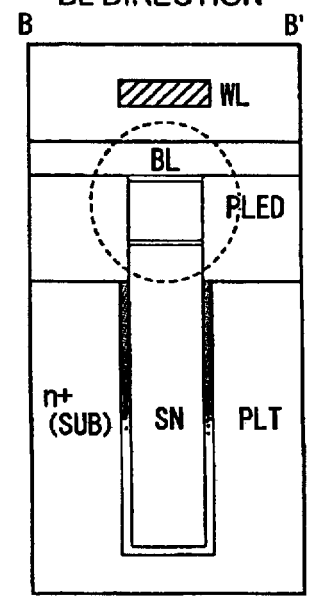
Figure 21A:
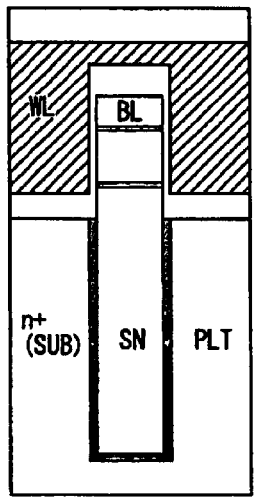
FIGS. 21A to 21F are structure sectional views, each showing another embodiment of the memory cell corresponding to the embodiment of FIG. 3.
Figure 21B:
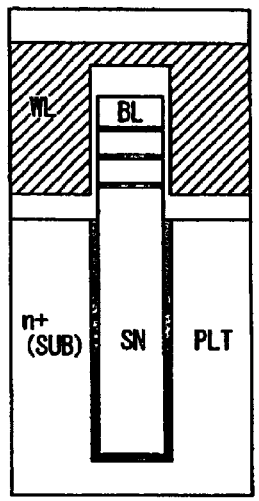
Figure 21C:
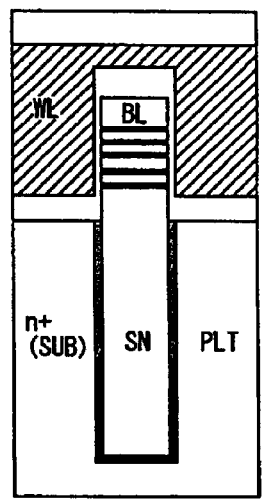
Figure 21D:
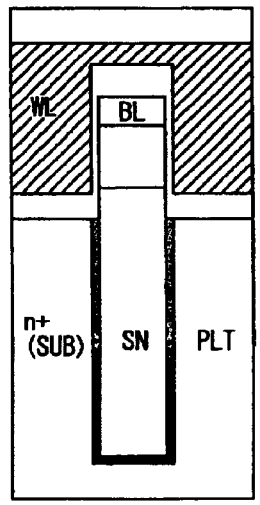
Figure 21E:
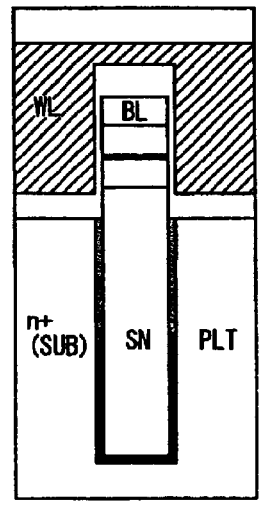
Figure 21F:
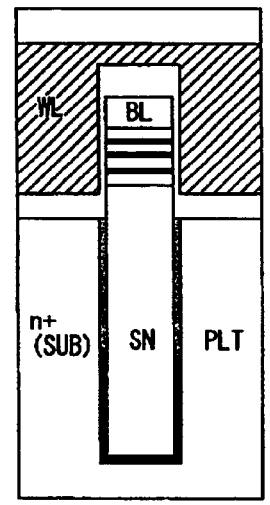

FIGS. 20A to 20C are equivalent circuit and structure sectional views, each showing an embodiment of a memory cell corresponding to the embodiment of FIG. 3. In FIGS. 20A to 20C, the equivalent circuit of the memory cell, a section of a word line WL direction, and a section of a bit line BL direction are respectively shown, where n+(SUB) is set as a common electrode PLT of a capacitor C, a groove is formed in a substrate SUB, and a storage node SN is formed through an insulation film as a dielectric film. The storage node SN constitutes a source and a drain of one side of a PLED transistor, and the other source and drain constituting a channel and a bit line are formed in a laminated structure. A gate electrode is constructed integrally with the word line WL, and a portion corresponding to a side of the channel functions as a gate electrode.

FIGS. 21A to 21F are structure sectional views, each showing another embodiment of the memory cell corresponding to the embodiment of FIG. 3. As shown in FIGS. 21A to 21F, various modifications can be made of the channel portion. As shown in FIGS. 20A to 20C, and FIGS. 21A to 21F, the PLED transistor of the memory cell has a structure of a barrier insulating film, e.g., silicon on insulator (SOI), and composed of a complete depletion MOS (channel portion is a conductor). A main feature of the PLED transistor is a vertical structure, where gate electrodes are disposed through oxide films in both sides of laminated multilayer polysilicon (n+poly Si-intrinsic poly Si-n+poly Si).

The gate electrodes made of poly Si in both sides are integrally formed, and always set at equal potentials. The poly Si layers corresponding to the bit line BL and the storage node SN) are doped with phosphorus of about $10^{20}$ cm$^{-3}$, constituting a drain D (or source S) and a source (or drain) of a transistor. The poly Si layer provided therebetween is an intrinsic Poly Si layer doped with phosphorus of very low concentration (about $10^{15}$ to $10^{17}$ cm$^{-3}$), constituting a substrate (channel) of the transistor.

Between the intrinsic poly Si layers, a tunnel film made of, e.g., a thin (2 to 3 nm) silicon nitride film (Si3N4), is formed. The tunnel film serves as a stopper to prevent high-concentration phosphorus of a drain or source region from being dispersed in an internal low-concentration layer during transistor formation. To supply a current between the drain and the source, these regions must be tunnel films not so large in thickness. In addition, in the center of the channel, to limit an OFF current of the transistor small, a tunnel film must be formed when necessary.

In FIGS. 20A to 20C, and FIGS. 21A to 21F, a thick line indicates the stopper film; and a thin line the tunnel film for limiting small the OFF current of the transistor. For example, in the memory cell of each of FIGS. 20A to 20C, and in FIG. 21A, the tunnel film for limiting the OFF current small is omitted and, in FIG. 21D, conversely, the stopper film is omitted. Other embodiments are modified examples regarding positions or the numbers of stopper films and tunnel films.

In the PLED transistor, the stopper function is provided to prevent holes or electrons generated on the poly Si layers in the transistor of an OFF state from flowing as currents between the drain and the source and, thus, in theory, it is possible to reduce generation of leakage current substantially to zero. However, since it is difficult to reduce the generation of leakage current to zero by the current manufacturing technology, according to the present invention, circuit means is provided to supply a reverse bias voltage to the gate, thereby reducing the generation of leakage current greatly.

Figure 22A:
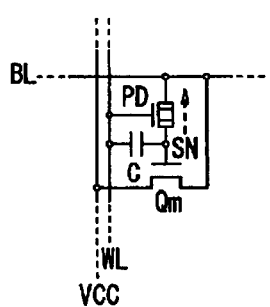
FIGS. 22A to 22C are equivalent circuit and structure sectional views, each showing an embodiment of a memory cell corresponding to the embodiment of FIG. 8.
Figure 22B:
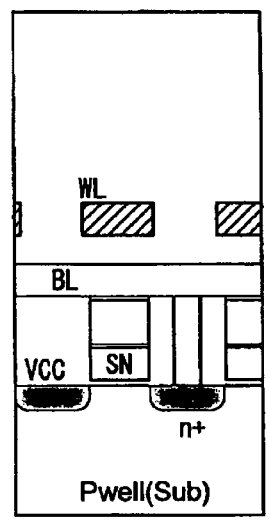
Figure 22C:
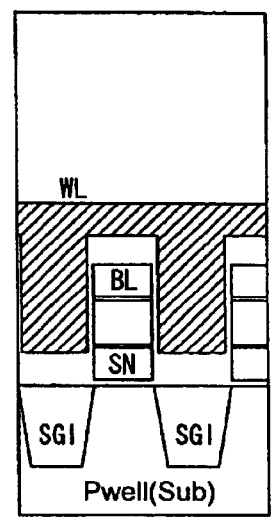

FIGS. 22A to 22C are structure sectional views, each showing an embodiment of a memory cell corresponding to the embodiment of FIG. 8. In FIGS. 22A to 22C, an equivalent circuit of the memory cell, a section of a word line WL direction, and a section of a bit line BL direction are shown. According to the embodiment, between a source and a drain diffusion layer n+, an amplifier (sense) MOSFET Qm is formed, where a storage node SN composed of the source and drain of the PLED transistor is set as gate electrode. A current of the amplifier MOSFET Qm flows in parallel with a substrate surface, while a current of the PLED transistor PD flows in a direction vertical to the same. Accordingly, even for a 2-transistor constitution, a memory cell having a small area, and only limited surface ruggedness can be manufactured. Therefore, a memory chip can be manufactured relatively easily at low costs.

Figure 23:
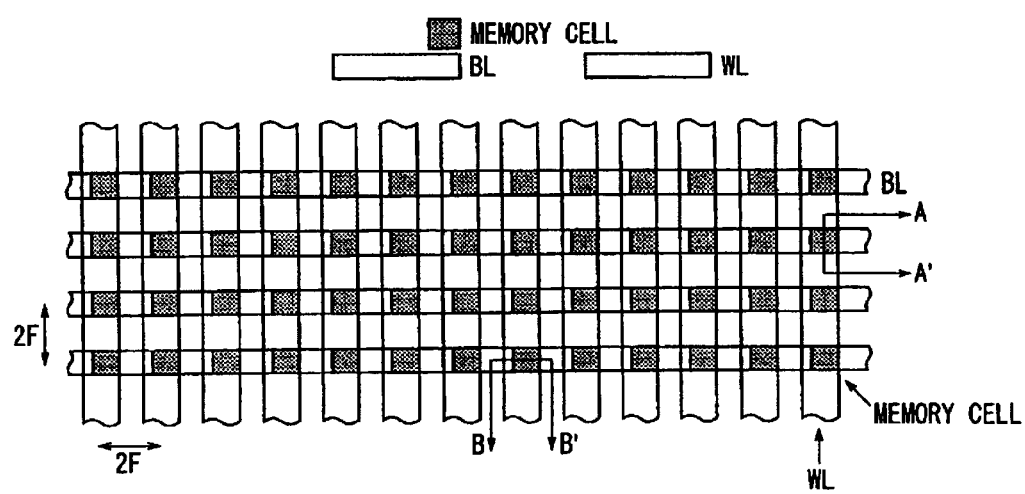
FIG. 23 is a pattern view showing an embodiment of a memory mat portion of the semiconductor memory of the present invention.

FIG. 23 is a pattern view showing an embodiment of a memory mat portion of the semiconductor memory of the present invention. The embodiment corresponds to a one intersection point system or an open bit system, where a bit line is formed to be extended to both sides around a sense amplifier. Thus, a memory cell is disposed at each point of intersection between a word line WL and a bit line BL. The memory cell may be composed of one transistor, and one capacitor as in the case shown by each of FIGS. 20A to 20C, or two transistors as in the case shown by each of FIGS. 22A to 22C.

Figure 24:
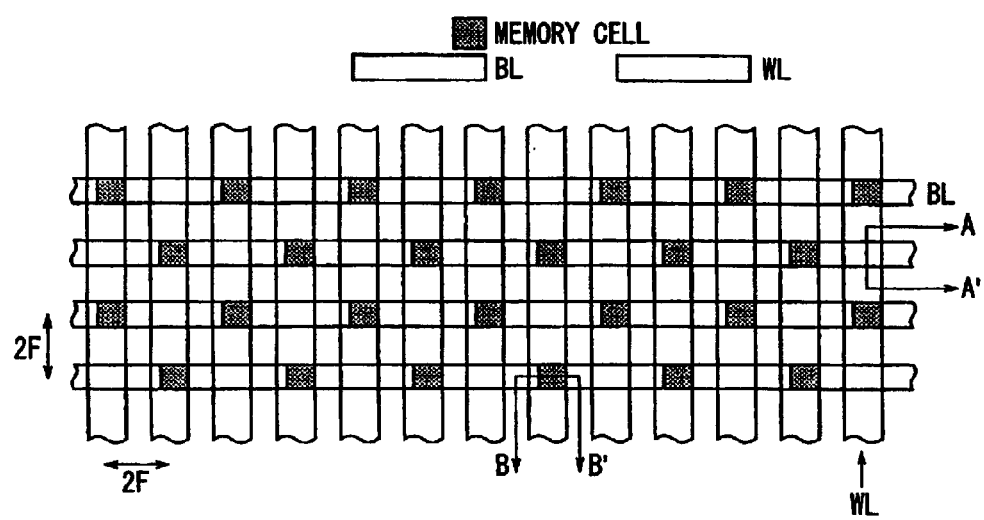
FIG. 24 is a pattern view showing another embodiment of a memory mat portion of the semiconductor memory of the present invention.

FIG. 24 is a pattern view showing another embodiment of a memory mat portion of the semiconductor memory of the present invention. The embodiment corresponds to a two intersection point system or a folded bit line system, where complimentary bit lines BL and BLB are extended in parallel with a sense amplifier. Thus, a memory cell is disposed at a point of intersection between a word line WL and the bit line BL or BLB. That is, seen from the sequence of the word line WL, memory cells are formed alternately between the bit lines BL and BLB. Such a memory cell may be compose of one transistor, and one capacitor as shown in each of FIGS. 20A to 20C or 21A to 21F, or two transistors as shown in each of FIGS. 22A to 22C.

As apparent from the foregoing embodiments, advantages of the embodiments can be summarized as follows.

(1) The semiconductor apparatus comprises, on one semiconductor substrate, a plurality of memory cells, each including a capacitor having first and second electrodes, and a switching device having a control terminal connected to a corresponding word line among a plurality of word lines, and a current channel connected between the first electrode and a corresponding bit line among a plurality of bit lines. In this case, when the semiconductor apparatus is on a first mode, an OFF potential of the word lines is set to be a first potential, when the semiconductor apparatus is on a second mode, an OFF potential of the word lines is set to be a second potential, and the current channel of the switching device is set in a direction vertical to the semiconductor substrate. Thus, by a simple constitution of circuit means, a large storage capacity and high operability can be achieved while reliability is increased.

(2) The semiconductor apparatus comprises, on one semiconductor substrate, a plurality of memory cells, each including a capacitor having first and second electrodes, and a switching device having a control terminal connected to a corresponding word line among a plurality of word lines, and a current channel connected between the first electrode and a corresponding bit line among a plurality of bit lines. In this case, when the semiconductor apparatus is on a first mode, an OFF potential of the word lines is set to be a first potential, when the semiconductor apparatus is on a second mode, an OFF potential of the word lines is set to be a second potential, and no leakage current channels are present between the switching device and the semiconductor substrate. Thus, by a simple constitution of circuit means, a large storage capacity and high operability can be achieved while reliability is increased.

(3) The semiconductor apparatus comprises, on one semiconductor substrate, a plurality of memory cells, each including a capacitor having first and second electrodes, and a switching device having a control terminal connected to a corresponding word line among a plurality of word lines, and a current channel connected between the first electrode and a corresponding bit line among a plurality of bit lines. In this case, when the semiconductor apparatus is on a first mode, an OFF potential of the word lines is set to be a first potential, when the semiconductor apparatus is on a second mode, an OFF potential of the word lines is set to be a second potential, and the switching device and the semiconductor substrate are insulated from each other by an insulating material. Thus, by a simple constitution of circuit means, a large storage capacity and high operability can be achieved while reliability is increased.

(4) According to the semiconductor apparatus, the first mode is a normal mode for enabling a writing/reading operation to be executed in each of the memory cells, the first potential is a ground potential of a circuit, the second mode is a data holding mode for executing no writing/reading in the memory cell, and the second potential is a negative voltage lower than the ground potential of the. circuit. Thus, consumption of current can be reduced on the data holding mode while a power source circuit is simplified.

(5) According to the semiconductor apparatus, the first mode is a normal mode for enabling a writing/reading operation to be executed in each of the memory cells, the first potential is a first negative voltage lower than a ground potential of a circuit, the second mode is a data holding mode for executing no writing/reading in the memory cell, and the second potential is a second negative voltage lower than the first negative voltage. Thus, by reducing the number of times of refreshing operations, much lower consumption of power can be achieved.

(6) According to the semiconductor apparatus, each of the memory cells includes a PLED transistor, and a capacitor, and a refreshing operation is executed corresponding to respective data holding times of the first and second modes. Thus, higher integration and lower consumption of power can be achieved.

(7) The semiconductor apparatus comprises on one semiconductor substrate: a plurality of memory cells, each including a MOSFET having an information voltage of a capacitor supplied to a gate, and a writing transistor for supplying the information voltage to the capacitor; a plurality of word lines connected to the second electrode of the capacitor, and a gate of the writing transistor; and a plurality of bit lines disposed in a direction orthogonal to the word lines for receiving a writing voltage and a source output of the MOSFET. In this case, when the semiconductor apparatus is on a first mode, an OFF potential of the word lines is set to be a first potential, when the semiconductor apparatus is on a second mode, an OFF potential of the word lines is set to be a second potential, when the semiconductor apparatus is on the first and second modes, an ON voltage of the word lines is set to be a third voltage for turning OFF the writing transistor when a signal corresponding to the information voltage is read, and turning ON the MOSFET when the information voltage of the capacitor is at a high level, and to be a fourth voltage for turning ON the writing transistor when a writing voltage is supplied from the bit lines to the capacitor, and the writing transistor and the semiconductor substrate are insulated from each other by an insulating material. Thus, by a simple constitution of circuit means, a large storage capacity and high operability can be achieved while reliability is increased.

(8) The semiconductor apparatus comprises on one semiconductor substrate: a plurality of memory cells, each including a MOSFET having an information voltage of a capacitor supplied to a gate, and a writing transistor for supplying the information voltage to the capacitor; a plurality of word lines connected to the second electrode of the capacitor, and a gate of the writing transistor; and a plurality of bit lines disposed in a direction orthogonal to the word lines for receiving a writing voltage and a source output of the MOSFET. In this case, when the semiconductor apparatus is on a first mode, an OFF potential of the word lines is set to be a first potential, when the semiconductor apparatus is on a second mode, an OFF potential of the word lines is set to be a second potential, when the semiconductor apparatus is on the first and second modes, an ON voltage of the word lines is set to be a third voltage for turning OFF the writing transistor when a signal corresponding to the information voltage is read to the bit lines, and turning ON the MOSFET when the information voltage of the capacitor is at a high level, and to be a fourth voltage for turning ON the writing transistor when a writing voltage is supplied from the bit lines to the capacitor, and no leakage current channels are present between the writing transistor and the semiconductor substrate. Thus, by a simple constitution of circuit means, a large storage capacity and high operability can be achieved while reliability is increased.

(9) The semiconductor apparatus comprises on one semiconductor substrate: a plurality of memory cells, each including a MOSFET having an information voltage of a capacitor supplied to a gate, and a writing transistor for supplying the information voltage to the capacitor; a plurality of word lines connected to the second electrode of the capacitor, and a gate of the writing transistor; and a plurality of bit lines disposed in a direction orthogonal to the word lines for receiving a writing voltage and a source output of the MOSFET. In this case, when the semiconductor apparatus is on a first mode, an OFF potential of the word lines is set to be a first potential, when the semiconductor apparatus is on a second mode, an OFF potential of the word lines is set to be a second potential, when the semiconductor apparatus is on the first and second modes, an ON voltage of the word lines is set to be a third voltage for turning OFF the writing transistor when a signal corresponding to the information voltage is read to the bit lines, and turning ON the MOSFET when the information voltage of the capacitor is at a high level, and to be a fourth voltage for turning ON the writing transistor when a writing voltage is supplied from the bit lines to the capacitor, and the writing transistor and the semiconductor substrate are insulated from each other by an insulating material. Thus, by a simple constitution of circuit means, a large storage capacity and high operability can be achieved while reliability is increased.

(10) According to the semiconductor apparatus, the first mode is a normal mode for enabling a writing/reading operation to be executed in each of the memory cells, the first potential is a ground potential of a circuit, the second mode is a data holding mode for executing no writing/reading in the memory cell, and the second potential is a negative voltage lower than the ground potential of the circuit. Thus, consumption of current can be reduced on the data holding mode while a power supply circuit is simplified.

(11) According to the semiconductor apparatus, the first mode is a normal mode for enabling a writing/reading operation to be executed in each of the memory cells, the first potential is a first negative voltage lower than a ground potential of a circuit, the second mode is a data holding mode for executing no writing/reading in the memory cell, and the second potential is a second negative voltage lower than the first negative voltage. Thus, by reducing the number of times of refreshing operations, much lower consumption of power can be achieved.

(12) According to the semiconductor apparatus, each of the memory cells includes a PLED transistor, and a capacitor, and a refreshing operation is executed corresponding to respective data holding times of the first and second modes. Thus, higher integration and lower consumption of power can be achieved.

The present invention has been described in detail with reference to the embodiments. Needless to say, however, the present invention is not limited to the embodiments, and various modifications and changes can be made without departing from the teachings of the present invention. For example, in FIG. 8, an arrangement may be made, where writing and reading word lines, and writing and reading bit lines are provided, an amplifier MOSFET and a selection MOSFET are connected in series, an amplifying signal of the amplifier MOSFET is transmitted through the reading word line to the reading bit line by the selection MOSFET and, during a writing operation, the PLED transistor is turned ON by the writing word line to supply a writing signal from the writing bit line. In this case, by disposing two gate electrodes between the source and the drain, the amplifier MOSFET and the selection MOSFET can be formed into one apparent MOSFET.

For the address selection circuit, the I/O interface circuit and the control circuit of the memory cell, circuits similar to general purpose memory circuits, e.g., a dynamic RAM, a synchronous DRAM or DDR, a synchronous DRAM and the like, which are well-known, can be used. The memory cell of the present invention is required only to use a switching device having no leakage current channels similar to that of pn junction as in the case of a transistor having a barrier insulation film, e.g., the PLED transistor. The present invention can be widely used for circuits designed to extend data holding time by using transistors having such barrier insulating film structures.

Advantages provided by representative ones of the foregoing embodiments are briefly as follows.

The semiconductor apparatus comprises, on one semiconductor substrate, a plurality of memory cells, each including a capacitor having first and second electrodes, and a switching device having a control terminal connected to a corresponding word line among a plurality of word lines, and a current channel connected between the first electrode and a corresponding bit line among a plurality of bit lines. In this case, when the semiconductor apparatus is on a first mode, an OFF potential of the word lines is set to be a first potential, when the semiconductor apparatus is on a second mode, an OFF potential of the word lines is set to be a second potential, and the current channel of the switching device is set in a direction vertical to the semiconductor substrate. Thus, by a simple constitution of circuit means, a large storage capacity and high operability can be achieved while reliability is increased.

The semiconductor apparatus comprises on one semiconductor substrate: a plurality of memory cells, each including a MOSFET having an information voltage of a capacitor supplied to a gate, and a writing transistor for supplying the information voltage to the capacitor; a plurality of word lines connected to the second electrode of the capacitor, and a gate of the writing transistor; and a plurality of bit lines disposed in a direction orthogonal to the word lines for receiving a writing voltage and a source output of the MOSFET. In this case, when the semiconductor apparatus is on a first mode, an OFF potential of the word lines is set to be a first potential, when the semiconductor apparatus is on a second mode, an OFF potential of the word lines is set to be a second potential, when the semiconductor apparatus is on the first and second modes, an ON voltage of the word lines is set to be a third voltage for turning OFF the writing transistor when a signal corresponding to the information voltage is read, and turning ON the MOSFET when the information voltage of the capacitor is at a high level, and to be a fourth voltage for turning ON the writing transistor when a writing voltage is supplied from the bit lines to the capacitor, and the writing transistor and the semiconductor substrate are insulated from each other by an insulating material. Thus, by a simple constitution of circuit means, a large storage capacity and high operability can be achieved while reliability is increased.

It should be further understood by those skilled in the art that the foregoing description has been made on embodiments of the invention and that various changes and modifications may be made in the invention without departing from the spirit of the invention and the scope of the appended claims.

What is claimed is:

1. A semiconductor apparatus formed on one semiconductor substrate, comprising:

a plurality of memory cells, each including a capacitor having first and second electrodes for holding an information voltage, a MOSFET having a gate connected to the first electrode of the capacitor and having the information voltage of the capacitor supplied to the gate, and a writing transistor for supplying the information voltage to the capacitor;

a plurality of word lines connected to the second electrode of the capacitor and a gate of the writing transistor; and a plurality of bit lines disposed in a direction orthogonal to the word lines for receiving a writing voltage and a source output of the MOSFET, wherein when the semiconductor apparatus is on a first mode, an OFF potential of the word lines is set to be a first potential, when the semiconductor apparatus is on a second mode, an OFF potential of the word lines is set to be a second potential, when the semiconductor apparatus is on the first and second modes, an ON voltage of the word lines is set to be a third voltage for turning OFF the writing transistor when a signal corresponding to the information voltage is read, and turning ON the MOSFET when the information voltage of the capacitor is at a high level, and to be a fourth voltage for turning ON the writing transistor when a writing voltage is supplied from the bit lines to the capacitor, and a current channel of the writing transistor is set in a direction vertical to the semiconductor substrate.

2. A semiconductor apparatus formed on one semiconductor substrate, comprising:

a plurality of memory cells, each including a capacitor having first and second electrodes for holding an information voltage, a MOSFET having a gate connected to the first electrode of the capacitor and having the information voltage of the capacitor supplied to the gate, and a writing transistor for supplying the information voltage to the capacitor;

a plurality of word lines connected to the second electrode of the capacitor and a gate of the writing transistor; and a plurality of bit lines disposed in a direction orthogonal to the word lines for receiving a writing voltage and a source output of the MOSFET, wherein when the semiconductor apparatus is on a first mode, an OFF potential of the word lines is set to be a first potential, when the semiconductor apparatus is on a second mode, an OFF potential of the word lines is set to be a second potential, when the semiconductor apparatus is on the first and second modes, an ON voltage of the word lines is set to be a third voltage for turning OFF the writing transistor when a signal corresponding to the information voltage is read to the bit lines, and turning ON the MOSFET when the information voltage of the capacitor is at a high level, and to be a fourth voltage for turning ON the writing transistor when a writing voltage is supplied from the bit lines to the capacitor, and no leakage current channels are present between the writing transistor and the semiconductor substrate.

3. A semiconductor apparatus formed on one semiconductor substrate, comprising:

a plurality of memory cells, each including a capacitor having first and second electrodes for holding an information voltage, a MOSFET having a gate connected to the first electrode of the capacitor and having the information voltage of the capacitor supplied to the gate, and a writing transistor for supplying the information voltage to the capacitor;

a plurality of word lines connected to the second electrode of the capacitor and a gate of the writing transistor; and a plurality of bit lines disposed in a direction orthogonal to the word lines for receiving a writing voltage and a source output of the MOSFET, wherein when the semiconductor apparatus is on a first mode, an OFF potential of the word lines is set to be a first potential, when the semiconductor apparatus is on a second mode, an OFF potential of the word lines is set to be a second potential, when the semiconductor apparatus is on the first and second modes, an ON voltage of the word lines is set to be a third voltage for turning OFF the writing transistor when a signal corresponding to the information voltage is read to the bit lines, and turning ON the MOSFET when the information voltage of the capacitor is at a high level, and to be a fourth voltage for turning ON the writing transistor when a writing voltage is supplied from the bit lines to the capacitor, and the writing transistor and the semiconductor substrate are insulated from each other by an insulating material.

4. A semiconductor apparatus according to claim 1, wherein the first mode is a normal mode for enabling a writing/reading operation to be executed in each of the memory cells, the first potential is a ground potential of a circuit, the second mode is a data holding mode for executing no writing/reading in the memory cell, and the second potential is a negative voltage lower than the ground potential of the circuit.

5. A semiconductor apparatus according to claim 1, wherein the first mode is a normal mode for enabling a writing/reading operation to be executed in each of the memory cells, the first potential is a first negative voltage lower than a ground potential of a circuit, the second mode is a data holding mode for executing no writing/reading in the memory cell, and the second potential is a second negative voltage lower than the first negative voltage.

6. A semiconductor apparatus according to claim 4, wherein each of the memory cells includes a PLED transistor, and a capacitor, and a refreshing operation is executed corresponding to respective data holding times of the first and second modes.

* * * * *